US008624765B2

(12) United States Patent
Watanabe

(10) Patent No.: US 8,624,765 B2
(45) Date of Patent: Jan. 7, 2014

(54) SAMPLE AND HOLD CIRCUIT AND A/D CONVERTER

(75) Inventor: Hikaru Watanabe, Nagoya (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 13/578,298

(22) PCT Filed: May 14, 2010

(86) PCT No.: PCT/JP2010/058228
§ 371 (c)(1),
(2), (4) Date: Aug. 10, 2012

(87) PCT Pub. No.: WO2011/142036
PCT Pub. Date: Nov. 17, 2011

(65) Prior Publication Data
US 2013/0050002 A1  Feb. 28, 2013

(51) Int. Cl.
*H03M 1/00* (2006.01)
(52) U.S. Cl.
USPC .......................................................... 341/122
(58) Field of Classification Search
USPC ................................ 341/122, 155; 327/94, 96
See application file for complete search history.

(56) References Cited

U.S. PATENT DOCUMENTS

| 4,893,122 A * | 1/1990 | Hoehn .......................... 341/122 |
| 5,172,117 A * | 12/1992 | Mills et al. ..................... 341/157 |
| 6,337,651 B1 * | 1/2002 | Chiang .......................... 341/161 |
| 7,969,336 B2 * | 6/2011 | Yoshioka ....................... 341/122 |

FOREIGN PATENT DOCUMENTS

| JP | 59-149418 | 8/1984 |
| JP | 5-284030 | 10/1993 |
| JP | 7-7426 | 1/1995 |
| JP | 2008-502264 | 1/2008 |

OTHER PUBLICATIONS

International Search Report in International Application No. PCT/JP2010/058228; Mailing Date: Jul. 6, 2010.
B. Razavi, "Design of Analog CMOS Integrated Circuits," McGraw-Hill, Pub., pp. 424-427 (2002).
B. Ginetti et al., "A CMOS 13-b Cyclic RSD A/D Converter," IEEE Journal of Solid-State Circuits, vol. 27, No. 7, pp. 957-965 (Jul. 1992).
M. Paavola et al., "A 62μA Interface ASIC for a Capacitive 3-Axis Micro-Accelerometer" 2007 IEEE International Solid-State Circuits Conference, Digest of Technical Papers, pp. 318-319 (Fig. 17.9.3) (2007).

* cited by examiner

*Primary Examiner* — Brian Young
(74) *Attorney, Agent, or Firm* — Finnegan, Henderson, Farabow, Garrett & Dunner, LLP

(57) ABSTRACT

The present invention is related to a sample and hold circuit and an A/D converter, and prevents an output saturation for an input voltage over a power supply voltage range in the sample and hold circuit. A first switch which is turned on when an input voltage is to be sampled; a sampling capacitor configured to sample the input voltage input via the first switch when the first switch is turned on, and sample a predetermined reference voltage when the first switch is turned off; an adding/subtracting part configured to perform an addition or a subtraction between the input voltage sampled by the sampling capacitor and the predetermined reference voltage sampled by the sampling capacitor; and a hold part configured to hold and output a voltage obtained by the addition or the subtraction by the adding/subtracting part are provided.

9 Claims, 13 Drawing Sheets

SAMPLE AND HOLD CIRCUIT AND A/D CONVERTER

CROSS-REFERENCE TO RELATED APPLICATIONS

This application is a national phase application of International Application No. PCT/JP2010/058228, filed May 14, 2010, the content of which is incorporated herein by reference.

TECHNICAL FIELD

The present invention is related to a sample and hold circuit and an A/D (Analog-to-Digital) converter. In particular, the present invention is related to a sample and hold circuit and an A/D converter suited for converting an input analog voltage to a digital value and outputting it.

BACKGROUND ART

An A/D converter for converting an input analog voltage to a digital value is known (for example, see Patent Document 1). The A/D converter disclosed in Patent Document 1 generates a determination signal according to a level of the input analog voltage, performs voltage-shifting based on the determination signal such that the sampled and held analog voltage falls in an input voltage range of the A/D converter, and then converts the voltage-shifted voltage to the digital value. Further, the A/D converter remove a component corresponding to the voltage shift from the digital value thus obtained by the conversion, thereby obtaining the digital value corresponding to the analog voltage.

[Patent Document 1] Japanese Laid-open Patent Publication No. 7-7426

DISCLOSURE OF INVENTION

Problem to be Solved by Invention

However, according to the A/D converter disclosed in Patent Document 1, the analog voltage to be input is not adjusted before the analog voltage is sampled and held. According to the configuration in which such an adjustment is not performed, an output saturation of the sample and hold circuit may occur if the analog voltage to be input is near a power supply potential. For this reason, according to the A/D converter disclosed in Patent Document 1, the A/D conversion of the input analog voltage may not be performed with high accuracy over a whole range from a negative power supply potential to a positive power supply potential.

The present invention is made in consideration of the matters described above, and an object of the invention is to provide a sample and hold circuit and an A/D converter which may prevent the output saturation for the input voltage from a negative power supply potential to a positive power supply potential.

Means to Solve the Problem

The object is achieved by a sample and hold circuit which includes a first switch which is turned on when an input voltage is to be sampled; a first sampling part configured to sample the input voltage input via the first switch when the first switch is turned on; a second sampling part configured to sample a predetermined reference voltage when the first switch is turned off; an adding/subtracting part configured to perform an addition or a subtraction between the input voltage sampled by the first sampling part and the predetermined reference voltage sampled by the second sampling part; and a hold part configured to hold and output a voltage obtained by the addition or the subtraction by the adding/subtracting part.

In this embodiment, the sample and hold circuit performs an addition or a subtraction between the sampled input voltage and the sampled predetermined reference voltage, and holds and outputs a voltage obtained by the addition or the subtraction. According to such a configuration, since a held voltage output from the sample and hold circuit can be adjusted, the output saturation can be prevented for the input voltage from a negative power supply potential to a positive power supply potential in the sample and hold circuit.

It is noted that the sample and hold circuit may be configured such that the first and second sampling parts are a common sampling capacitor which is capable of accumulating input charge according to the input voltage and reference charge according to the reference voltage, the adding/subtracting part includes a second switch which is turned on after the input charge is accumulated in the sampling capacitor; a temporary storage capacitor to which the input charge accumulated in the sampling capacitor is transferred when the second switch is turned on; a third switch which is turned on after the input charge accumulated in the sampling capacitor is transferred to the temporary storage capacitor; and a re-transferring part which returns the input charge, which has been transferred to the temporary storage capacitor, after the reference charge is accumulated in the sampling capacitor when the third switch is turned on, in order to perform the addition or the subtraction of the charge accumulated in the sampling capacitor.

Further, the sample and hold circuit may be configured such that hold part includes an operational amplifier; and a fourth switch which is provided on a line connecting a connection point between the first switch and the sampling capacitor and an output terminal of the operational amplifier and turned on when a hold output is performed, and the second switch and the temporary storage capacitor are provided on a line connecting a connection point between the sampling capacitor and an input terminal of the operational amplifier and a connection point between the fourth switch and the output terminal of the operational amplifier.

Further, the sample and hold circuit may be configured such that a capacity of the temporary storage capacitor is greater than that of the sampling capacitor.

Further, the sample and hold circuit may be configured such that the adding/subtracting part includes a first comparing part configured to determine whether the input voltage sampled by the first sampling part is greater than a first predetermined value; and an applying voltage switching part configured to switch, according to a determination result of the first comparing part, the predetermined reference voltage to be applied to an input side terminal of the sampling capacitor when the third switch is turned on at the time of transferring the input charge accumulated in the sampling capacitor to the temporary storage capacitor.

Further, the sample and hold circuit may be configured such that the hold part includes an operational amplifier, and the adding/subtracting part includes a fifth switch configured to electrically connect an output side terminal of the temporary storage capacitor and the output terminal of the operational amplifier after the input charge accumulated in the sampling capacitor is transferred to the temporary storage capacitor; a second comparing part configured to determine whether a voltage of the output terminal of the operational amplifier after the input charge accumulated in the sampling capacitor is transferred to the temporary storage capacitor; and a sampling voltage switching part configured to switch the predetermined reference voltage sampled by the second sampling part according to a determination result of the second comparing part, and the re-transferring part returns the input charge, which has been transferred to the temporary storage capacitor, to the sampling capacitor in which the reference charge according to the predetermined reference voltage is accumulated, after the reference voltage is sampled by the second sampling part.

Further, the sample and hold circuit may be applied to an A/D converter which includes an A/D converting part configured to perform an A/D conversion of an analog output voltage output by the hold part of the sample and hold circuit; and a digital value calculating part configured to derive an output digital value by performing an addition or a subtraction between a digital value obtained as a result of the A/D conversion by the A/D converting part and a digital value corresponding to the predetermined reference voltage sampled by the second sampling capacitor.

Further, the object is achieved by a sample and hold circuit for sampling and holding a potential difference between two input voltages. The sample and hold circuit includes a pair of first switches which is turned on when the respective input voltages are to be sampled; a pair of sampling capacitors configured to accumulate input charges according to the input voltages input via the first switches in order to sample the input voltages input via the first switches when the first switches are turned on and reference charges according to two predetermined reference voltages in order to sample the predetermined reference voltages when the first switches are turned off; an adding/subtracting part configured to perform an addition or a subtraction between the input voltages sampled by the pair of the sampling capacitors and the predetermined reference voltages sampled by the pair of the sampling capacitors; and a hold part configured to hold and output the potential difference between two voltages obtained by the addition or the subtraction by the adding/subtracting part. The adding/subtracting part includes a pair of second switches which is turned on after the input charges are accumulated in the pair of the sampling capacitors; a pair of temporary storage capacitors to which the input charges accumulated in the pair of the sampling capacitors are transferred when the pair of the second switches is turned on; a third switch configured to connect input side terminals of the pair of the sampling capacitors when the input charges accumulated in the pair of the sampling capacitors are transferred to the pair of the temporary storage capacitors; a pair of fourth switches which is turned on after the input charges accumulated in the pair of the sampling capacitors are transferred to the pair of the temporary storage capacitors; and a re-transferring part which returns the input charges, which have been transferred to the pair of the temporary storage capacitors, after the reference charges are accumulated in the pair of the sampling capacitors when the pair of the fourth switches is turned on, in order to perform the addition or the subtraction of the charges accumulated in the pair of the sampling capacitors.

In this embodiment, the sample and hold circuit performs an addition or a subtraction between the sampled two input voltages and the sampled two predetermined reference voltages, and holds and outputs a potential difference between two voltages obtained by the addition or the subtraction. According to such a configuration, since the potential difference between these two held voltages output from the sample and hold circuit can be adjusted, the output saturation can be prevented for the input voltage from a negative power supply potential to a positive power supply potential in the sample and hold circuit.

It is noted that the sample and hold circuit may be configured such that the adding/subtracting part removes an amount of charges when turning on the pair of the fourth switches causes the reference charges to be accumulated in the pair of the sampling capacitors, the amount of charges corresponding to an input common-mode and remaining in the pair of the sampling capacitors.

Further, the sample and hold circuit may be applied to an A/D converter which includes an A/D converting part configured to perform an A/D conversion of a potential difference between two analog output voltages output by the hold part of the sample and hold circuit; and a digital value calculating part configured to derive an output digital value by performing an addition or a subtraction between a digital value obtained as a result of the A/D conversion by the A/D converting part and digital values according to the predetermined reference voltages sampled by the pair of the sampling capacitors.

Advantage of the Invention

According to the present invention, the output saturation for the input voltage over a power supply voltage range in the sample and hold circuit can be prevented.

Figure 1:
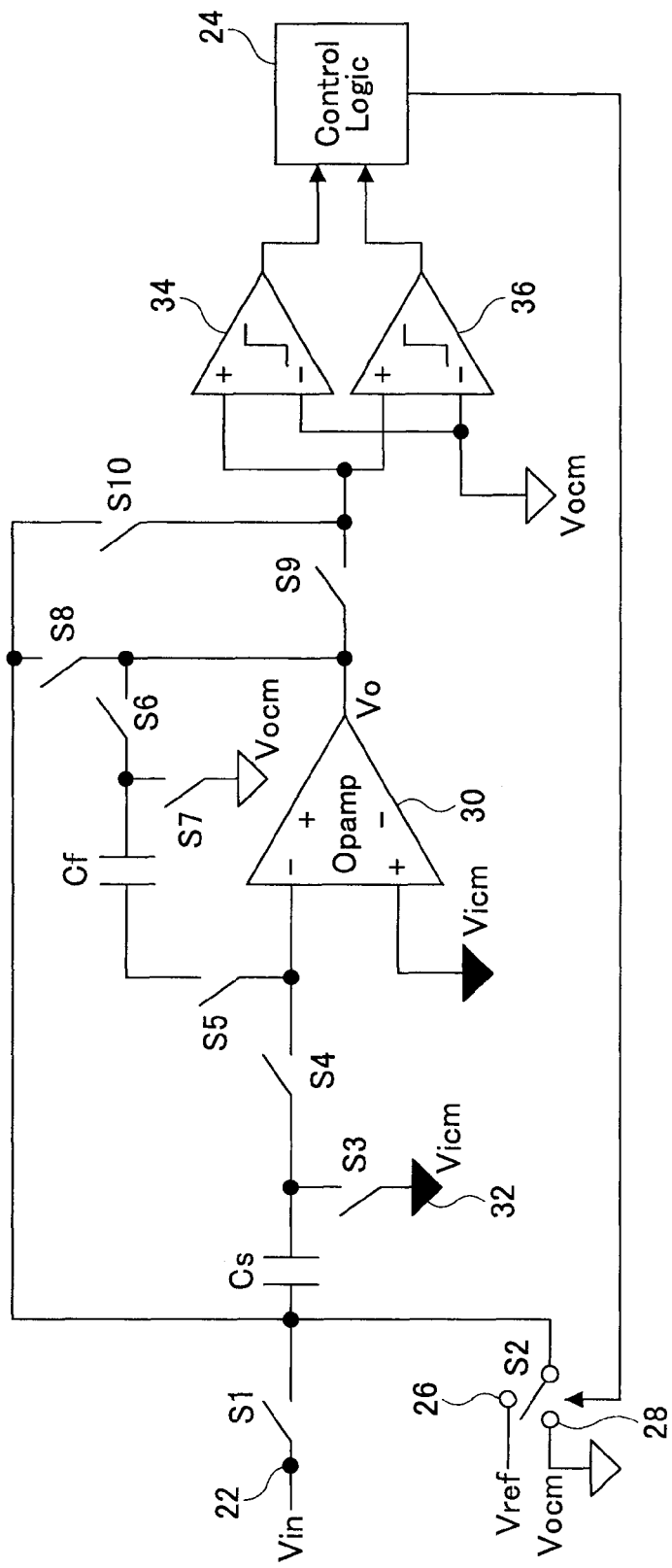
FIG. 1 is a diagram for illustrating a configuration of a sample and hold circuit according a first embodiment of the present invention.

DESCRIPTION OF REFERENCE SYMBOLS 20, 100 sample and hold circuit
22, 102p, 102n input terminal
24, 104 control circuit
26, 28, 32, 106, 108, 110, 122 reference terminal
30, 120 operational amplifier
34, 36, 124, 126 comparator
Cs sampling capacitor
Cf temporary storage capacitor
S1 through S11 switch
Vin, Vinp, Vinn input analog potential
Vin' input analog voltage
Vicm input common-mode potential
Vo, Vop, Von output analog potential
Vo' output analog voltage
Vocm output common-mode potential
Vref, Vrefp, Vrefn reference potential
Vref' reference voltage

BEST MODE FOR CARRYING OUT THE INVENTION

In the following, concrete embodiments of a sample and hold circuit and an A/D (Analog-to-Digital) converter according the present invention will be described in detail by referring to the accompanying drawings.

[First Embodiment]

FIG. 1 is a diagram for illustrating a configuration of a sample and hold circuit 20 according a first embodiment of the present invention. The sample and hold circuit 20 according the embodiment is of a single-ended input type for sampling and holding an input analog voltage and outputting it. The sample and hold circuit 20 is applied to an A/D converter (an algorithmic ADC, a cyclic ADC, a pipelined ADC, or the like) which converts the input analog voltage to a digital value.

As illustrated in FIG. 1, the sample and hold circuit 20 includes a capacitor Cs which is capable of sampling the input analog voltage. In the following, the capacitor Cs is referred to as a sampling capacitor Cs. It is assumed that the sampling capacitor Cs has a capacity Cs. An input side terminal of the sampling capacitor Cs is connected to an input terminal 22 via a switch S1. To the input terminal 22 is input an analog potential Vin which is to be A/D converted. The switch S1 is provided for connecting or disconnecting the input side terminal of the sampling capacitor Cs and the input terminal 22.

The switch S1 is controlled by a control circuit 24 described hereinafter. Specifically, the switch S1 is controlled such that it is turned off when the input analog potential Vin is not to be sampled while it is turned on when the input analog potential Vin is to be sampled. The sampling capacitor Cs is capable of accumulating input charge according to the analog potential Vin input via the switch S1 when the switch S1 is in its ON state, and performs sampling of the input analog voltage by such accumulation of the input charge.

Further, to the input side terminal of the sampling capacitor Cs are connected a first reference terminal 26 and a second reference terminal 28 via a switch S2. The switch S2 is provided for connecting or disconnecting the first reference terminal 26 or the second reference terminal 28 and the input side terminal of the sampling capacitor Cs. The switch S2 connects the input side terminal of the sampling capacitor Cs to the first reference terminal 26 or the second reference terminal 28 or disconnects it from the first reference terminal 26 or the second reference terminal 28.

To the first reference terminal 26 is supplied a reference potential Vref. Further, to the second reference terminal 28 is supplied an output common-mode potential Vocm. The switch S2 is controlled by the control circuit 24. Specifically, the switch S2 is controlled such that it connects the first reference terminal 26 and the input side terminal of the sampling capacitor Cs when the reference potential Vref is to be sampled and it connects the second reference terminal 28 and the input side terminal of the sampling capacitor Cs when the output common-mode potential Vocm is to be sampled.

The sampling capacitor Cs is capable of accumulating reference charge according to the reference potential Vref input via the switch S2 when the switch S2 connects the first reference terminal 26 and the input side terminal of the sampling capacitor Cs, and performs sampling of the reference potential Vref by such accumulation of the reference charge. On the other hand, the sampling capacitor Cs is capable of accumulating reference charge according to the output common-mode potential Vocm input via the switch S2 when the switch S2 connects the second reference terminal 28 and the input side terminal of the sampling capacitor Cs, and performs sampling of the potential Vocm by such accumulation of the reference charge.

It is noted that in the embodiment it is assumed that the reference potential Vref corresponds to a positive power supply potential VDD (Vref=VDD), and the output common-mode potential Vocm is set to an intermediate value (=(VDD+VSS)/2) between the output common-mode potential Vocm and the positive power supply potential VDD. The output common-mode potential Vocm is set to zero, for example. Further, in the following, it is assumed that the input analog potential Vin input to the sample and hold circuit 20 with reference to the output common-mode potential Vocm is an input analog voltage Vin' (=input analog potential Vin−Vocm), the output analog potential Vo output from the sample and hold circuit 20 with reference to the output common-mode potential Vocm is an output analog voltage Vo' (=output analog potential Vo−Vocm), the reference potential Vref with reference to the output common-mode potential Vocm voltage is a reference voltage Vref' (=reference potential Vref−Vocm).

The sample and hold circuit 20 further includes an operational amplifier 30. To the output side terminal of the sampling capacitor Cs are connected a third reference terminal 32 via a switch S3 and a negative input terminal (an inverting terminal) of the operational amplifier 30 via a switch S4. To the third reference terminal 32 is input an input common-mode potential Vicm of the operational amplifier 30. Further, a positive input terminal (a non-inverting terminal) of the operational amplifier 30 is connected to a terminal to which the input common-mode potential Vicm is input.

It is noted that in the embodiment the input common-mode potential Vicm is an appropriate voltage for operating the operational amplifier 30 and can be set independently from the output common-mode potential Vocm. However, in the following, it is assumed that the input common-mode potential Vicm is the same as the output common-mode potential Vocm (i.e., Vicm=Vocm). It is noted that since electrical shortings between the input terminal and the output terminal of the operational amplifier 30 cause an offset cancellation, the electrical shortings cause the input common-mode potential Vicm and the output common-mode potential Vocm to automatically be equal to each other. Further, it is assumed that the operational amplifier 30 has a sufficient gain for an output range whose center is located at the output common-mode potential Vocm. The output range is about a half of the potential difference between the positive power supply potential VDD and the negative power supply potential VSS (specifically, the output range is from $-(VDD-VSS)/2-\alpha$ to $+(VDD-VSS)/2+\alpha$, where $\alpha$ is a small value, "0.2", for example).

The switch S3 is provided for connecting or disconnecting the output side terminal of the sampling capacitor Cs and the third reference terminal 32. The switch S3 is controlled by the control circuit 24. Specifically, the switch S3 is controlled such that it is turned off when the sampling at the sampling capacitor Cs is not to be performed while it is turned on when the sampling at the sampling capacitor Cs is to be performed. The switch S4 is provided for connecting or disconnecting the output side terminal of the sampling capacitor Cs and the negative input terminal of the operational amplifier 30. The switch S4 is controlled by the control circuit 24 as described hereinafter.

The negative input terminal of the operational amplifier 30 is connected to a capacitor Cf via a switch S5. The switch S5 is provided for connecting or disconnecting the negative input terminal of the operational amplifier 30 and the input side terminal of the capacitor Cf. The switch S5 is controlled by the control circuit 24 as described hereinafter. The capacitor Cf is a temporary storage capacitor to which the charge accumulated in the sampling capacitor Cs is transferred. In the following, the capacitor Cf is referred to as a temporary storage capacitor Cf. It is assumed that the temporary storage capacitor Cf has a capacity Cf. The capacity Cf of the temporary storage capacitor Cf is set such that it is greater than the capacity Cs of the sampling capacitor Cs (i.e., Cf=a*Cs, where a is greater than 1, a=2, for example).

To an output side terminal of the temporary storage capacitor Cf are connected the output terminal of the operational amplifier 30 via a switch S6 and the second reference terminal 28 via a switch S7. The switch S6 is provided for connecting or disconnecting the output side terminal of the temporary storage capacitor Cf and the output terminal of the operational amplifier 30. The switch S6 is controlled by the control circuit 24. Further, the switch S7 is provided for connecting or disconnecting the output side terminal of the temporary storage capacitor Cf and the second reference terminal 28. The switch S7 is controlled by the control circuit 24.

Further, the output terminal of the operational amplifier 30 is connected to the input side terminal of the sampling capacitor Cs via a switch S8. The switch S8 is provided for connecting or disconnecting the output terminal of the operational amplifier 30 and the input side terminal of the sampling capacitor Cs. The switch S8 is controlled by the control circuit 24.

To the output terminal of the operational amplifier 30 are connected positive input terminals of two comparators 34 and 36 via a switch S9. The switch S9 is provided for connecting or disconnecting the output terminal of the operational amplifier 30 and the positive input terminals of the comparators 34 and 36. The switch S9 is controlled by the control circuit 24. Further, the positive input terminals of the comparators 34 and 36 are connected to the input side terminal of the sampling capacitor Cs via a switch S10. The switch S10 is provided for connecting or disconnecting the positive input terminals of the comparators 34 and the input side terminal of the sampling capacitor Cs. The switch S10 is controlled by the control circuit 24.

To negative input terminals of the comparators 34 and 36 is connected a second reference terminal 28. The comparators 34 and 36 have offsets, respectively. The comparators 34 and 36 compare the voltages input to the input terminals thereof and output comparison results to the control circuit 24 when the switch S9 or S10 is in its ON state. Specifically, at that time, the comparators and 36 compare the analog potential Vo at the output terminal of the operational amplifier 30 or the input analog potential Vin with a voltage (i.e., a value described in detail hereinafter) based on the output common-mode potential Vocm, and outputs the comparison results to the control circuit 24. The control circuit 24 controls connection/disconnection of the switch S2 based on the comparison results of the comparators 34 and 36 as described hereinafter.

Next, with reference to FIG. 2 through FIG. 6, operations of the sample and hold circuit 20 and the A/D converter according to the embodiment are described.

Figure 2:
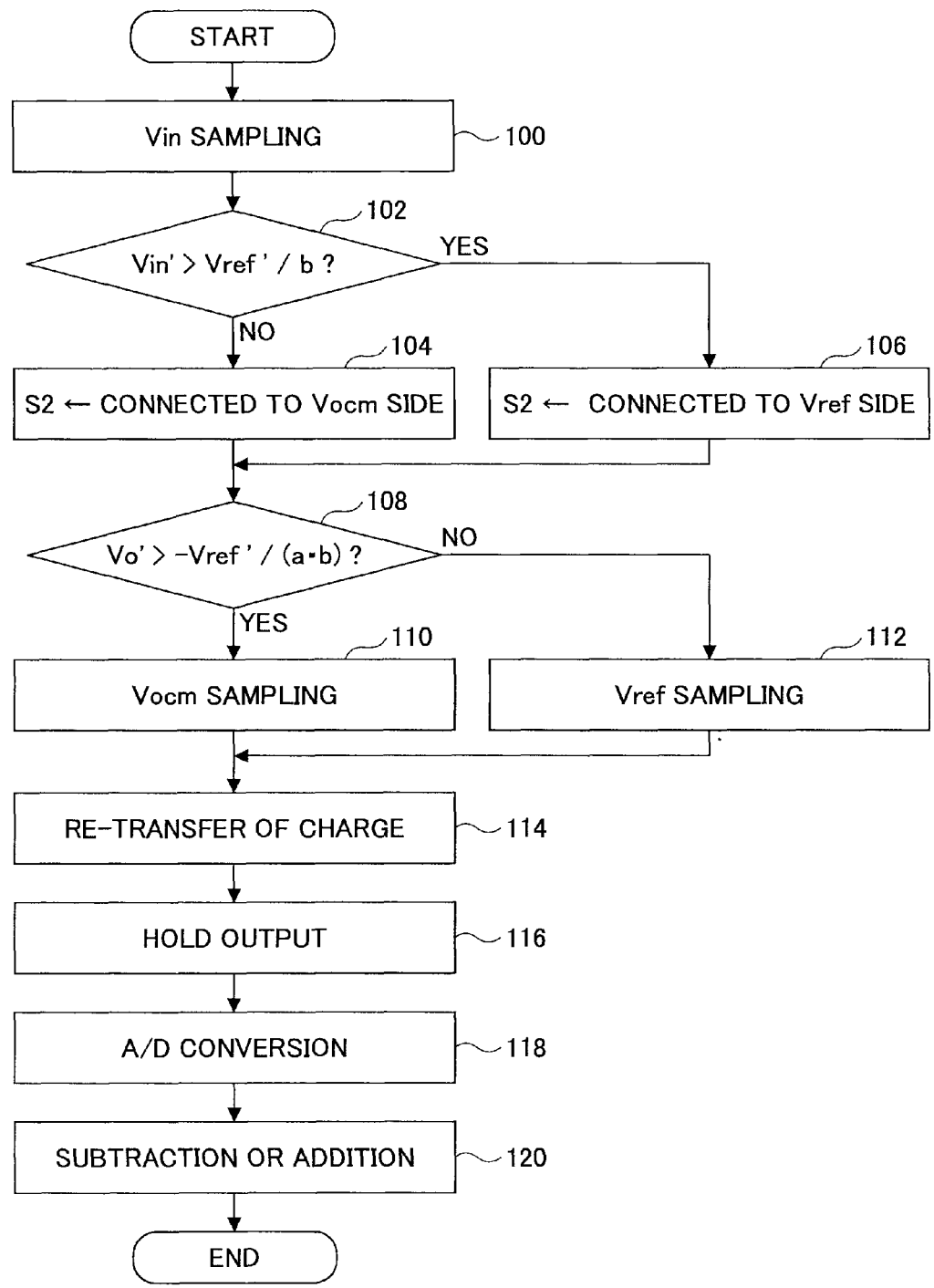
FIG. 2 is a flowchart of an example of a control routine executed in an A/D converter including the sample and hold circuit according the first embodiment of the present invention.
Figure 3:
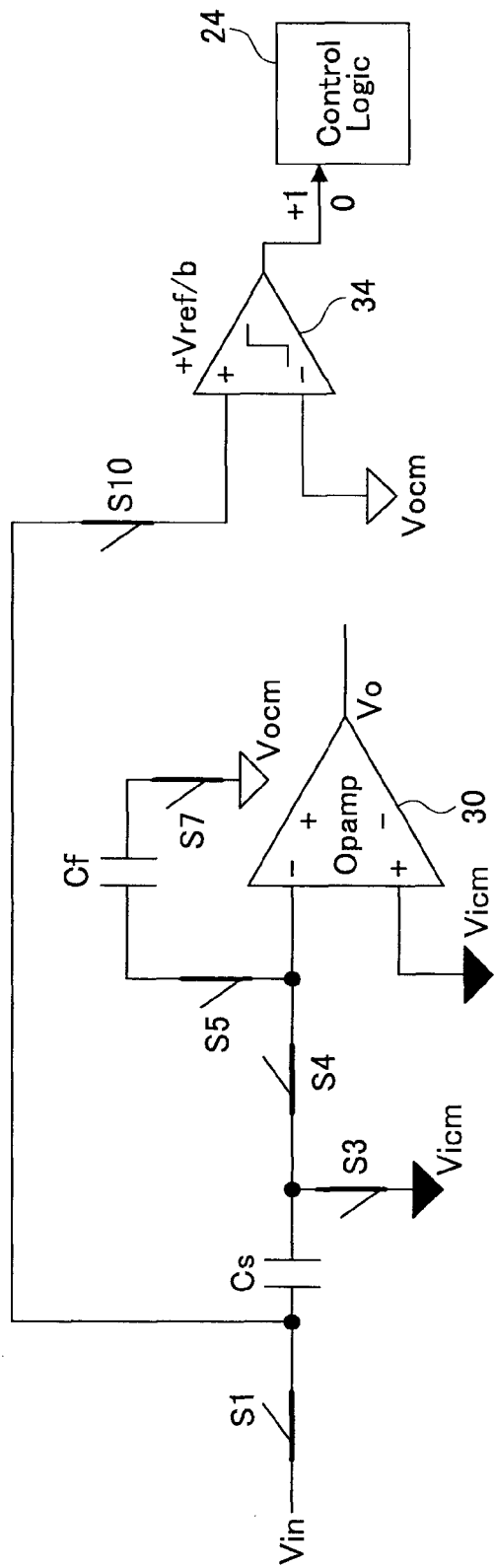
FIG. 3 is a diagram for illustrating a status of the sample and hold circuit according the first embodiment of the present invention which is implemented at the time of sampling an input analog potential Vin.
Figure 4:
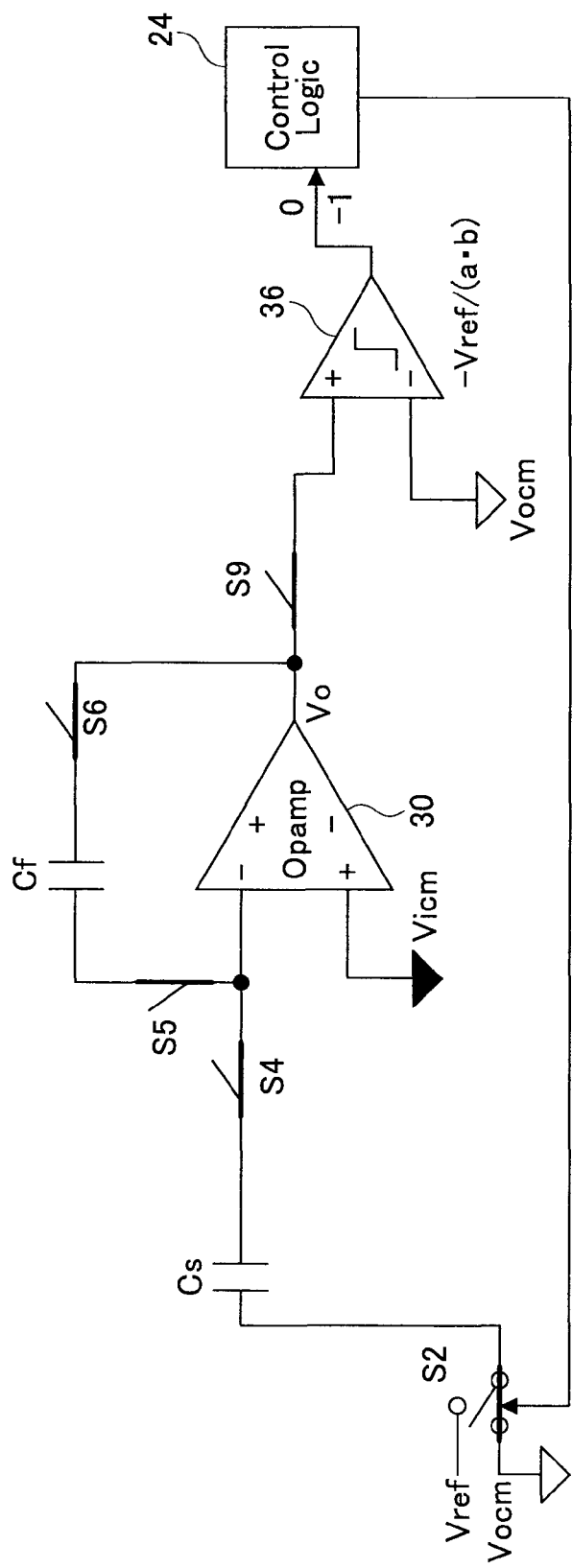
FIG. 4 is a diagram for illustrating a status of the sample and hold circuit according the first embodiment of the present invention which is implemented at the time of transferring charge from a sampling capacitor Cs to a temporary storage capacitor Cf.
Figure 5:
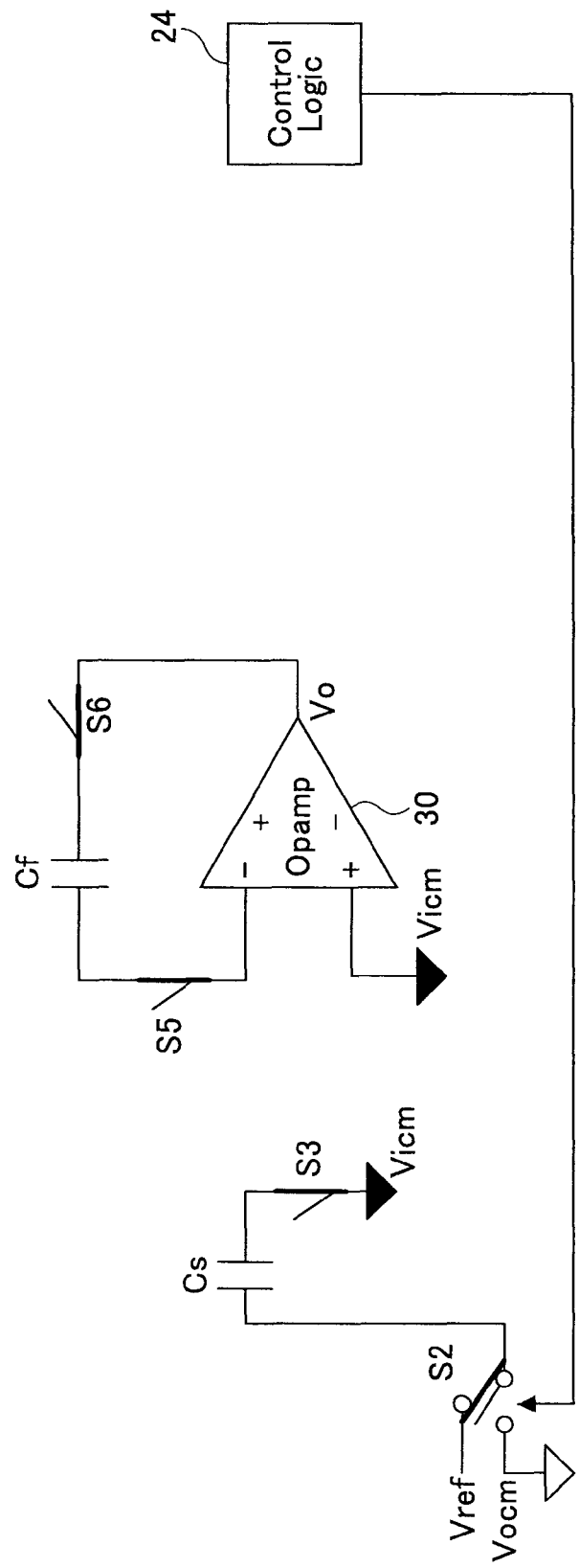
FIG. 5 is a diagram for illustrating a status of the sample and hold circuit according the first embodiment of the present invention which is implemented at the time of sampling a reference potential Vref.
Figure 6:
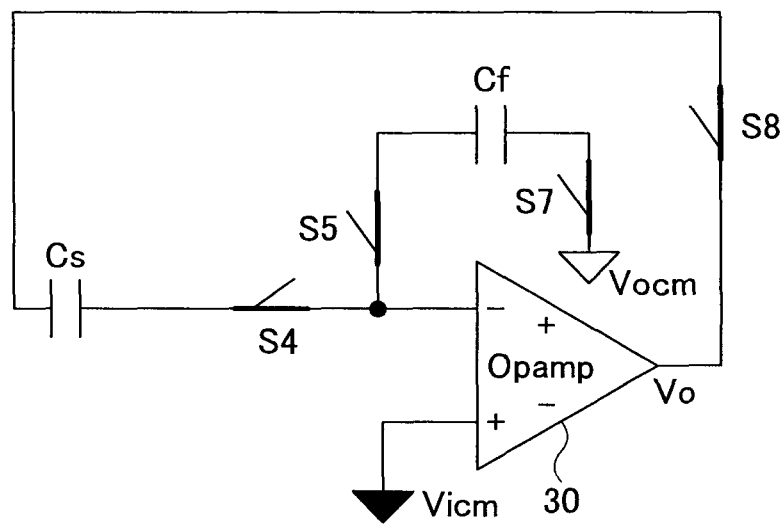
FIG. 6 is a diagram for illustrating a status of the sample and hold circuit according the first embodiment of the present invention which is implemented at the time of transferring charge from the temporary storage capacitor Cf to the sampling capacitor Cs.

FIG. 2 is a flowchart of an example of a control routine executed in an A/D conversion device including the sample and hold circuit 20 according the embodiment. FIG. 3 is a diagram for illustrating a status of the sample and hold circuit 20 according the embodiment which is implemented at the time of sampling the input analog potential Vin (the input analog voltage Vin'). FIG. 4 is a diagram for illustrating a status of the sample and hold circuit 20 according the embodiment which is implemented at the time of transferring charge from the sampling capacitor Cs to the temporary storage capacitor Cf. FIG. 5 is a diagram for illustrating a status of the sample and hold circuit 20 according the embodiment which is implemented at the time of sampling the reference potential Vref (the reference voltage Vref'). Further, FIG. 6 is a diagram for illustrating a status of the sample and hold circuit 20 according the embodiment which is implemented at the time of transferring charge from the temporary storage capacitor Cf to the sampling capacitor Cs.

In the embodiment, the switch S1 is in its OFF state immediately before the A/D converter performs the A/D conversion. When the A/D conversion is performed in such a status, at first, the control circuit 24 of the sample and hold circuit 20 performs sampling of the input analog potential Vin (step 100). Specifically, at that time, the control circuit 24 turns on the switch S1 from its OFF state, turns the switches S2, S8 and S9 off, and turns the switch S3 on (see FIG. 3).

When the switches S1 and S3 are turned on and the switch S2 is turned off, a potential difference (input voltage) between the analog potential Vin input to the input terminal 22 and the input common-mode potential Vicm is applied to the sampling capacitor Cs and thus the charge (input charge) according to the potential difference is accumulated in the sampling capacitor Cs. In this case, the sampling of the input analog potential Vin is performed at the sampling capacitor Cs.

It is noted that the control circuit 24 turns the switches S4, S5 and S7 on and turns the switch S6 off (see FIG. 3) when or before the sampling of the input analog potential Vin is performed at the sampling capacitor Cs. When the switches S4, S5 and S7 are turned on and the switch S6 is turned off, the temporary storage capacitor Cf is short-circuited to the output common-mode potential Vocm and thus the remaining charge accumulated in the temporary storage capacitor Cf is discharged. For this reason, if the sampling of the input analog potential Vin is performed at the sampling capacitor Cs, the charge accumulated in the temporary storage capacitor Cf is reset.

Further, when the sampling of the input analog potential Vin is performed at the sampling capacitor Cs, the control circuit 24 turns the switch S10 on (see FIG. 3). When the switch S10 is turned on, the input analog potential Vin input to the input terminal 22 is input to the positive input terminal of the comparator 34. The comparator 34 supplies the comparison result to the control circuit 24. The comparison result indicates whether the input analog potential Vin input to the positive input terminal is greater than the output common-mode potential Vocm input to the negative input terminal by more than 1/b of the reference voltage Vref', that is to say, whether the input analog voltage Vin' is greater than the 1/b of the reference voltage Vref' (i.e., Vin'>Vref'/b). The control circuit 24 determines whether the input analog voltage Vin' is greater than the 1/b of the reference voltage Vref' based on the comparison result information from the comparator 34 (step 102). However, a value of b is greater than 1, which is necessary to perform the process for preventing the output saturation even though the input analog potential Vin is within a predetermined range which is out of the range from the negative power supply potential VSS to the positive power supply potential VDD. The value of b is 2, for example.

It is noted that if the sampling of the input analog potential Vin is performed at the sampling capacitor Cs, the output terminal of the operational amplifier 30 may be opened or short-circuited to the output common-mode potential Vocm. Alternatively, the input terminal and the output terminal of the operational amplifier 30 may be short-circuited to implement the offset cancellation.

If the sampling of the input analog potential Vin at the sampling capacitor Cs is completed and the input charge according to the input analog potential Vin (specifically, Vin−Vicm) is accumulated in the sampling capacitor Cs, then the control circuit 24 performs a process for transferring the input charge accumulated in the sampling capacitor Cs to the temporary storage capacitor Cf. Specifically, at that time, the control circuit 24 turns off the switches S1 and S7 from their ON states, and turns on the switches S6 and S9 from their OFF states (see FIG. 4).

If the control circuit 24 determines that the condition Vin'>Vref'/b is not met based on the comparison result of the comparator 34 in step 102, the control circuit 24 connects the switch S2 to the second reference terminal 28 to connect the second reference terminal 28 and the sampling capacitor Cs (step 104). When such a connection is implemented, the output common-mode potential Vocm is applied to the input side terminal of the sampling capacitor Cs, and the input charge according to the input analog potential Vin accumulated in the sampling capacitor Cs with reference to the applied potential Vocm is transferred to the temporary storage capacitor Cf. In this case, since the voltage across the temporary storage capacitor Cf is Cs/Cf*Vin', the analog potential Vo at the output terminal of the operational amplifier 30 is the potential (Vo=Cs/Cf*Vin'+Vocm) according to the respective capacities Cs and Cf of the sampling capacitor Cs and the temporary storage capacitor Cf and the input analog voltage Vin'.

On the other hand, if the control circuit determines that the condition Vin'>Vref'/b is met based on the comparison result of the comparator 34 in step 102, the control circuit 24 connects the switch S2 to the first reference terminal 26 to connect the first reference terminal 26 and the sampling capacitor Cs (step 106). When such a connection is implemented, the reference potential Vref is applied to the input side terminal of the sampling capacitor Cs, and the input charge according to the input analog potential Vin accumulated in the sampling capacitor Cs with reference to the applied potential Vref is transferred to the temporary storage capacitor Cf. In this case, since the charge according to the reference voltage Vref' remains at the sampling capacitor Cs, the voltage across the temporary storage capacitor Cf is (Cs/Cf)*(Vin'−Vref'), and the analog potential Vo at the output terminal of the operational amplifier 30 is the potential (Vo=(Cs/Cf)*(Vin'−Vref')+Vocm) according to the respective capacities Cs and Cf of the sampling capacitor Cs and the temporary storage capacitor Cf, the input analog voltage Vin' and the reference voltage Vref'.

Thus, the charge transferred from the sampling capacitor Cs to the temporary storage capacitor Cf corresponds to the input analog voltage Vin' (specifically, (Cs/Cf)*Vin') if the input analog voltage Vin' is not greater than 1/b of the reference voltage Vref', while it corresponds to the value (specifically, (Cs/Cf)*(Vin'−Vref')) which is obtained by subtracting the reference voltage Vref' from the input analog potential Vin if the input analog voltage Vin' is greater than 1/b of the reference voltage Vref'. In this way, after the sampling of the input analog potential Vin at the sampling capacitor Cs is completed, the charge according to the magnitude of the input analog voltage Vin' is transferred to the temporary storage capacitor Cf.

According to such a configuration, if it is assumed, for example, that the condition a=2 is met with respect to the ratio between the capacity Cs of the sampling capacitor Cs and the capacity Cf of the temporary storage capacitor Cf and the condition b=2 is met with respect to the value b, the output analog voltage Vo' falls within a range from −Vref'/2 to +Vref'/4 (i.e., −Vref'/2=<Vo'=<+Vref'/4) when the input analog voltage Vin' has a range from −Vref' to +Vref'/2. Further, when the input analog voltage Vin' has a range from +Vref'/2 to a value near +Vref', the output analog voltage Vo' falls within a range from −Vref'/4 to a value near 0 (i.e., the output common-mode potential Vocm) (i.e., −Vref'=<Vo'=<0). For this reason, at the time of transferring the charge from the sampling capacitor Cs to the temporary storage capacitor Cf, the output saturation of the operational amplifier 30 is prevented.

It is noted that if the charge is transferred from the sampling capacitor Cs to the temporary storage capacitor Cf as described above, the output analog potential Vo (=Vo'+Vocm) at the output terminal of the operational amplifier 30 is input to the positive input terminal of the comparator 36. The comparator 36 supplies the comparison result to the control circuit 24. The comparison result indicates whether the output analog potential Vo input to the positive input terminal is greater than the output common-mode potential Vocm input to the negative input terminal by more than 1/(a*b) of the reference voltage Vref', that is to say, whether the output analog voltage Vo' is greater than the 1/(a*b) of the negative reference voltage Vref' (i.e., Vo'>−Vref'/(a*b)). The control circuit 24 determines whether the condition Vo'>−Vref'/(a*b) is met based on the comparison result information from the comparator 36.

After the transfer of the charge from the sampling capacitor Cs to the temporary storage capacitor Cf is completed, if the control circuit 24 determines that the condition Vo'>−Vref'/

(a*b) is met based on the comparison result of the comparator 36 in step 108, it performs a process for sampling the output common-mode potential Vocm (step 110). Specifically, at that time, the control circuit 24 connects the switch S2 to the second reference terminal 28, turns on the switch S3 from its OFF state, and turns off the switch S4 from its ON state.

When the switch S2 is connected to the second reference terminal 28 and the switch S3 is turned on, the potential difference (0 in the embodiment) between the output common-mode potential Vocm input to the second reference terminal 28 and the input common-mode potential Vicm is applied to the sampling capacitor Cs, and thus the charge according to the potential difference is accumulated in the sampling capacitor Cs. Thus, if the condition Vo'>−Vref'/(a*b) is met, the sampling of the output common-mode potential Vocm is performed at the sampling capacitor Cs.

On the other hand, after the transfer of the charge from the sampling capacitor Cs to the temporary storage capacitor Cf is completed, if the control circuit 24 determines that the condition Vo'>−Vref'/(a*b) is not met based on the comparison result of the comparator 36 in step 108, it performs a process for sampling the reference potential Vref (step 112). Specifically, at that time, the control circuit 24 connects the switch S2 to the first reference terminal 26, turns on the switch S3 from its OFF state, and turns off the switch S4 from its ON state (see FIG. 5).

When the switch S2 is connected to the first reference terminal 26 and the switch S3 is turned on, the potential difference between the reference potential Vref input to the first reference terminal 26 and the input common-mode potential Vicm is applied to the sampling capacitor Cs, and thus the charge according to the potential difference is accumulated in the sampling capacitor Cs. Thus, if the condition Vo'>−Vref'/(a*b) is not met, the sampling of the reference potential Vref is performed at the sampling capacitor Cs.

It is noted that the control circuit 24 keeps the ON states of the switches S5 and S6 and turns off the switches S4 and S9 from their ON states when the control circuit 24 performs the sampling of the output common-mode potential Vocm or the reference potential Vref at the sampling capacitor Cs (see FIG. 5). When such a process is performed, the charge transferred to the temporary storage capacitor Cf and accumulated therein is held in the temporary storage capacitor Cf.

When the sampling of the output common-mode potential Vocm or the reference potential Vref at the sampling capacitor Cs is performed as described above, then the control circuit 24 performs a process for returning the charge, which has been transferred to the temporary storage capacitor Cf and accumulated therein, to the sampling capacitor Cs (step 114). Specifically, at that time, the control circuit 24 turns off the switches S2, S3 and S6 from their ON states, and turns on the switches S4, S7 and S8 from their OFF states. When such states of the respective switches are implemented, the charge (specifically, the charge according to the input analog voltage Vin' or a voltage obtained by subtracting the reference voltage Vref' from the input analog voltage Vin') accumulated in the temporary storage capacitor Cf with reference to the output common-mode potential Vocm is re-transferred to the sampling capacitor Cs.

When such a re-transfer of the charge is performed, the voltage across the sampling capacitor Cs is Vin' or Vin'−Vref', if the condition Vo'>−Vref'/(a*b) is met and thus the sampling of the output common-mode potential Vocm at the sampling capacitor Cs is performed in step 110. It is noted that the voltage across the sampling capacitor Cs is Vin' when the condition Vin'>+Vref'/b is not met, and the voltage across the sampling capacitor Cs is Vin'−Vref' when the condition Vin'>+Vref'/b is met.

On the other hand, if the condition Vo'>−Vref'/(a*b) is not met and thus the sampling of the reference potential Vref is performed at the sampling capacitor Cs, the voltage across the sampling capacitor Cs is Vin'+Vref'. It is noted that the voltage across the sampling capacitor Cs is Vin'+Vref' when the condition Vo'>−Vref'/(a*b) is not met, that is to say, when Vin'<−Vref'/b is met.

Thus, the voltage across the sampling capacitor Cs after the re-transfer of the charge from the temporary storage capacitor Cf to the sampling capacitor Cs is Vin'+Vref' if Vin'<−Vref'/b, Vin' if −Vref'/b<Vin'<Vref'/b, and Vin'−Vref' if Vin'>+Vref'/b. For this reason, the output analog voltage Vo' at the output terminal of the operational amplifier 30 falls within a range from −Vref' to +Vref'. The voltage across the sampling capacitor Cs is sampled and held as the output analog voltage Vo' of the operational amplifier 30 (step 16).

In this way, according to the sample and hold circuit 20 of the present embodiment, if the input analog voltage Vin' is within a range from the negative power supply potential VSS (=−Vref') to the positive power supply potential VDD (=+Vref'), the output analog voltage Vo' sampled and held to be output can be adjusted to fall within the range from −Vref' to +Vref'.

As described above, the value of b is greater than 1, which is necessary to perform the process for preventing the output saturation even though the input analog potential Vin is within a predetermined range which is out of the range from the negative power supply potential VSS to the positive power supply potential VDD. For this reason, the sample and hold circuit 20 performs the sample and hold process without causing the output saturation of the operational amplifier 30, if the input analog potential Vin is near the negative power supply potential VSS or the positive power supply potential VDD, or if the input analog potential Vin is slightly smaller than the negative power supply potential VSS or greater than the positive power supply potential VDD. In other words, the sample and hold circuit 20 can prevent the output saturation for the input analog potential Vin from the negative power supply potential VSS to the positive power supply potential VDD (and further the input analog potential Vin which is slightly smaller than the negative power supply potential VSS or greater than the positive power supply potential VDD) in performing the sample and hold process. Further, conversely, the sample and hold circuit 20 can increase a range of the input analog potential Vin which is permitted in terms of preventing the output saturation to b times (greater than one time) of the power supply potentials VSS and VDD with respect to the input common-mode potential Vicm.

It is noted that, according to the sample and hold circuit 20 described above, in the course of holding and outputting the output analog potential Vo based on the input analog potential Vin, the sampling of the input analog potential Vin is performed at the sampling capacitor Cs, the sampling of the reference potential Vref or the output common-mode potential Vocm after the transfer of the charge from the sampling capacitor Cs to the temporary storage capacitor Cf is performed at the sampling capacitor Cs, and then the charge accumulated in the temporary storage capacitor Cf is returned to the sampling capacitor Cs to perform the hold and output process from the operational amplifier 30. In the sample and hold circuit 20, the respective processes from the input of the input analog potential Vin to the output of the output analog potential Vo are performed using the sampling capacitor Cs as a base point. For this reason, even if the ratio between the capacity of the sampling capacitor Cs and the capacity of the temporary storage capacitor Cf (i.e., the value a) has variations, the sample and hold circuit 20 can perform the hold and output process of the output analog potential Vo without being influenced by the variations.

In the embodiment, the A/D converter converts the output analog potential Vo output from the sample and hold circuit 20 to a digital value (step 118). It is noted that since the output analog potential Vo output from the sample and hold circuit 20 is obtained through an addition or a subtraction of the charge or the voltage due to the charge transfer between the sampling capacitor Cs and the temporary storage capacitor Cf and the voltage sampling, it does not correspond to the input analog potential Vin in a one-to-one relationship.

Therefore, the A/D converter adds or subtracts a digital value corresponding to the added or subtracted charge or voltage, if necessary, to or from the digital value obtained by the A/D conversion in step 118 to calculate a final output digital value. Then, the A/D converter outputs the calculated final digital value to the outside.

Specifically, when the A/D converter performs the addition or the subtraction of the charge or the voltage due to the charge transfer between the sampling capacitor Cs and the temporary storage capacitor Cf or the voltage sampling, it stores the fact in a memory at that time. Then, the A/D converter determines that the addition or the subtraction of the charge is not performed in the processes from the input of the input analog potential Vin to the output of the output analog potential Vo based on the information stored in the memory if −Vref'/b<Vin'<Vref'/b, and outputs the digital value, which is obtained by A/D converting the output analog potential Vo, as it is as the final output digital value. Further, the A/D converter determines that the subtraction of the charge corresponding to the reference voltage Vref' from the charge accumulated in the sampling capacitor Cs is performed at the time of transferring the charge from the sampling capacitor Cs to the temporary storage capacitor Cf based on the information stored in the memory if Vin'>+Vref'/b, and outputs the digital value, which is obtained by adding the digital value corresponding the reference voltage Vref' to the digital value obtained by A/D converting the output analog potential Vo in order to compensate for the subtraction, as the final output digital value. Further, the A/D converter determines that the addition of the charge corresponding the reference voltage Vref' to the charge accumulated in the sampling capacitor Cs is performed by re-transferring the charge from the temporary storage capacitor Cf to the sampling capacitor Cs after the sampling of the reference potential Vref is performed based on the information stored in the memory if Vin'<−Vref'/b, and outputs the digital value, which is obtained by subtracting the digital value corresponding the reference voltage Vref' from the digital value obtained by A/D converting the output analog potential Vo in order to compensate for the addition, as the final output digital value.

According to the digital process, a digital output which corresponds to the input analog potential Vin in a one-to-one relationship can be obtained. Thus, according to the A/D converter, it is possible to precisely perform the A/D conversion of the input analog potential Vin in the range which is slightly greater than the range from the negative power supply potential VSS to the positive power supply potential VDD, in addition to the range from the negative power supply potential VSS to the positive power supply potential VDD. Further, according to the digital process, a precise A/D conversion to obtain the digital output which corresponds to the input analog potential Vin in a one-to-one relationship can be implemented by simple digital calculations such an addition or a subtraction of the digital value.

It is noted that the comparators 34 and 36 of the sample and hold circuit 20 have predetermined offsets; however, even if the offsets have deviations from design values, they do not substantially affect A/D conversion characteristics of the A/D converter. This is because if the operational amplifier 30 has a sufficient gain over the output voltage range, the A/D converted digital value or the final digital output value obtained by addition or the subtraction of the value is not affected, although the offset variations of the comparators 34 and 36 have a slight influence on the output voltage of the operational amplifier 30.

According to the first embodiment described above, the switch S1 corresponds to "a first switch" in claims; the sampling capacitor Cs corresponds to "a first sampling part" and "a second sampling part" in claims; the reference potential Vref (reference voltage Vref') or the output common-mode potential Vocm corresponds to "a predetermined reference voltage" in claims; the switches S4, S5 and S7 correspond to "a second switch" in claims; the switch S2 corresponds to "a third switch" in claims; "an adding/subtracting part" and "a hold part" in claims are implemented by the processes 102 through 108, 114 and 116 executed by the switches S2 through S10, the temporary storage capacitor Cf, the operational amplifier 30, the comparators 34 and 36 and the control circuit 24; and "a re-transferring part" in claims is implemented by the process 114 executed by the control circuit 24.

Further, the switch S8 corresponds to "a fourth switch" in claims, the switch S6 corresponds to "a fifth switch" in claims, "a first comparing part" in claims is implemented by the process 102 executed by the control circuit 24, "an applying voltage switching part" in claims is implemented by the processes 104 and 106 executed by the control circuit 24, "a second comparing part" in claims is implemented by the process 108 executed by the control circuit 24, "sampling voltage switching part" in claims is implemented by the processes 110 and 112 executed by the control circuit 24, "an A/D converting part" in claims is implemented by the process 118 executed by the A/D converter, and "a digital value calculating part" is implemented by the process 108 executed by the A/D converter.

[Second Embodiment]

Figure 7:
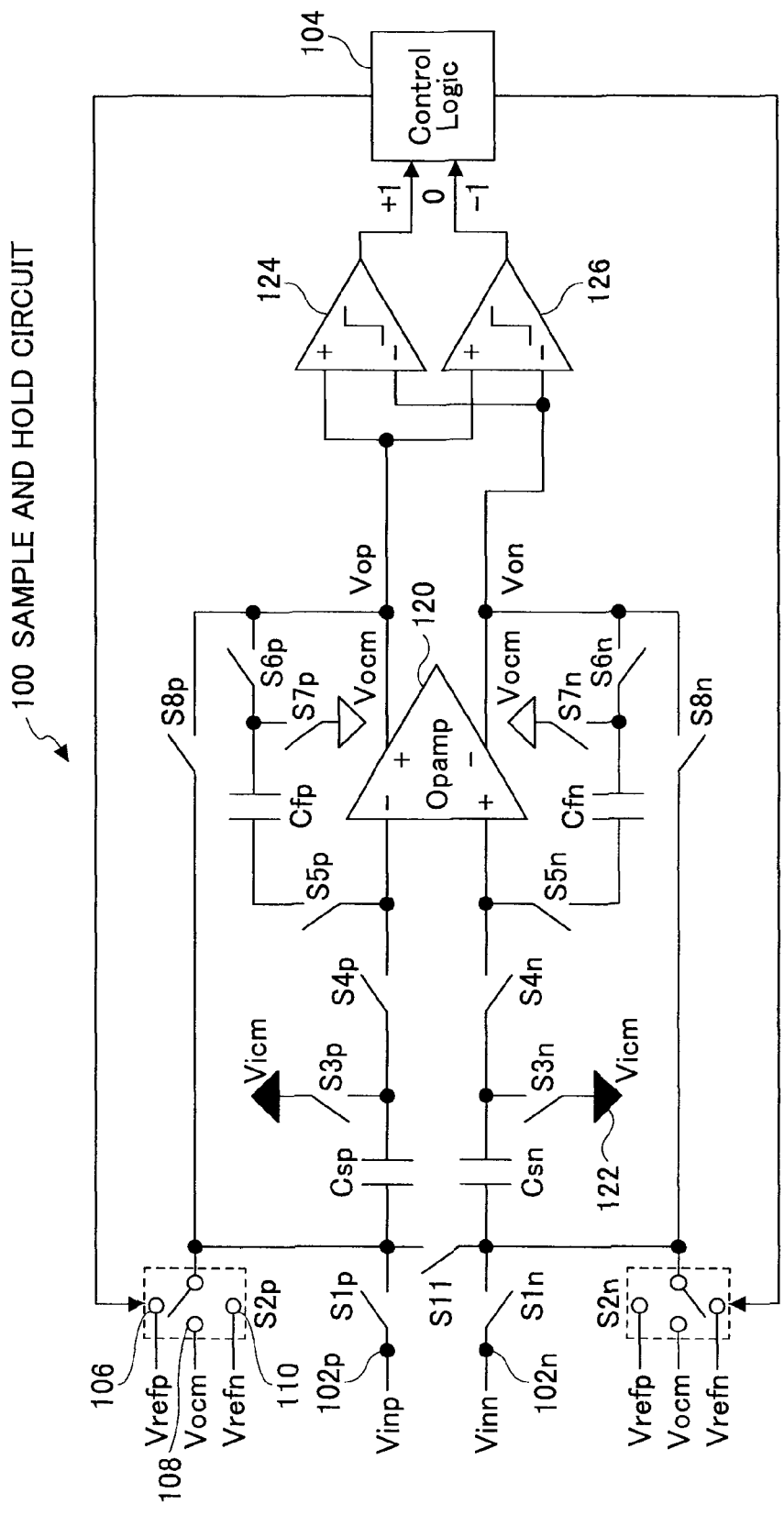
FIG. 7 is a diagram for illustrating a configuration of a sample and hold circuit according a second embodiment of the present invention.

FIG. 7 is a diagram for illustrating a configuration of a sample and hold circuit 100 according a second embodiment of the present invention. The sample and hold circuit 100 according the embodiment is of a differential input type for sampling and holding a potential difference between two input analog voltages and outputting it. The sample and hold circuit 20 is applied to an A/D converter (an algorithmic ADC, a cyclic ADC, a pipelined ADC, or the like) which converts the input analog voltage to a digital value.

As illustrated in FIG. 7, the sample and hold circuit 100 includes a pair of capacitors Csp and Csn which capacitors are capable of sampling two input analog voltages. In the following, the capacitors Csp and Csn are referred to as sampling capacitors Csp and Csn. It is assumed that the sampling capacitors Csp and Csn have capacities Csp and Csn. To an input side terminal of the sampling capacitor Csp is connected an input terminal 102p via a switch S1p, and to an input side terminal of the sampling capacitor Csn is connected an input terminal 102n via a switch S1n. To the input terminal 102p is input an input analog potential Vinp, and to the input terminal 102n is input an input analog potential Vinn. The switch S1p is provided for connecting or disconnecting the input side terminal of the sampling capacitor Csp and the input terminal 102p. Further, the switch S1n is provided for connecting or disconnecting the input side terminal of the sampling capacitor Csn and the input terminal 102n.

The switches S1p and S1n are controlled by a control circuit 104 described hereinafter. Specifically, the switches S1p and S1n are controlled such that the switches S1p and S1n are turned off when the input analog potentials Vinp and Vinn are not to be sampled while the switches S1p and S1n are turned on when the input analog potentials Vinp and Vinn are to be sampled. The sampling capacitor Csp is capable of accumulating input charge according to the analog potential Vinp input via the switch S1p when the switch S1p is in its ON state, and performs sampling of the input analog voltage by such accumulation of the input charge. The sampling capacitor Csn is capable of accumulating input charge according to the analog potential Vinn input via the switch S1n when the switch S1n is in its ON state, and performs sampling of the input analog voltage by such accumulation of the input charge.

Further, to the input side terminal of the sampling capacitor Csp are connected a first reference terminal 106, a second reference terminal 108 and a third reference terminal 110 via a switch S2p. Further, to the input side terminal of the sampling capacitor Csn are connected the first reference terminal 106, the second reference terminal 108 and the third reference terminal 110 via a switch S2n. The switches S2p and S2n are provided for connecting or disconnecting the first, the second and the third reference terminals 106, 108 and 110 and the input side terminals of the sampling capacitors Csp and Csn. The switches S2p and S2n connect the input side terminals of the sampling capacitors Csp and Csn to any of the first, the second and the third reference terminals 106, 108 and 110.

To the first reference terminal 106 is supplied a reference potential Vrefp. Further, to the second reference terminal 108 is supplied an output common-mode potential Vocm. Further, to the third reference terminal 110 is supplied a reference potential Vrefn. The switches S2p and S2n are controlled by the control circuit 104. Specifically, the switches S2p and S2n are controlled such that the switches S2p and S2n connect the first reference terminals 106 and the input side terminals of the sampling capacitors Csp and Csn when the reference potential Vrefp is to be sampled, connect the second reference terminals 108 and the input side terminals of the sampling capacitors Csp and Csn when the output common-mode potential Vocm is to be sampled, and connect the third reference terminals 110 and the input side terminals of the sampling capacitors Csp and Csn when the reference potential Vref is to be sampled.

The sampling capacitors Csp and Csn are capable of accumulating reference charges according to the reference potential Vrefp input via the switches S2p and S2n when the switches S2p and S2n connect the first reference terminals 106 and the input side terminals of the sampling capacitors Csp and Csn, and performs sampling of the reference potential Vrefp by such accumulation of the reference charges. On the other hand, the sampling capacitors Csp and Csn are capable of accumulating reference charges according to the output common-mode potential Vocm input via the switches S2p and S2n when the switches S2p and S2n connect the second reference terminals 108 and the input side terminals of the sampling capacitors Csp and Csn, and perform sampling of the output common-mode potential Vocm by such accumulation of the reference charges. Further, the sampling capacitors Csp and Csn are capable of accumulating reference charges according to the reference potential Vrefn input via the switches S2p and S2n when the switches S2p and S2n connect the third reference terminals 110 and the input side terminals of the sampling capacitors Csp and Csn, and perform sampling of the reference potential Vrefn by such accumulation of the reference charges.

In the embodiment, it is assumed that the reference potential Vrefp is the positive power supply potential VDD and the reference potential Vrefn is the negative power supply potential VSS (i.e., Vrefp=VDD, and Vrefn=VSS). Further, the output common-mode potential Vocm is set to an intermediate value (=(VDD+VSS)/2) between the positive power supply potential VDD and the negative power supply potential VSS. It is noted that if it is assumed that reference potential Vrefp is the positive power supply potential VDD and the reference potential Vrefn is the negative power supply potential VSS, the output common-mode potential Vocm is an intermediate value (=(Vrefp+Vrefn)/2) between the reference potential Vrefp and the reference potential Vrefn.

Further, the input side terminal of the sampling capacitor Csp is connected to the input side terminal of the sampling capacitor Csn via a switch 11. The switch 11 is provided for connecting or disconnecting the input side terminals of the sampling capacitor Csp and Csn, and is controlled by the control circuit 104 as described hereinafter.

The sample and hold circuit 100 further includes an operational amplifier 120. To the output side terminal of the sampling capacitor Csp are connected a fourth reference terminal 122 via a switch S3p and a negative input terminal (an inverting terminal) of the operational amplifier 120 via a switch S4p. Further, to the output side terminal of the sampling capacitor Csn are connected the fourth reference terminal 122 via a switch S3n and a positive input terminal (a non-inverting terminal) of the operational amplifier 120 via a switch S4n. To the fourth reference terminals 122 is input an input common-mode potential Vicm of the operational amplifier 120.

It is noted that in the embodiment the input common-mode potential Vicm is an appropriate voltage for operating the operational amplifier 120 and can be set independently from the output common-mode potential Vocm. Specifically, the input common-mode potential Vicm is an intermediate value (=(Vinp+Vinn)/2) between the input analog potential Vinp and the input analog potential Vinn. However, the input common-mode potential Vicm may be the same as the output common-mode potential Vocm (i.e., Vicm=Vocm). It is noted that since electrical shortings between the input terminal and the output terminal of the operational amplifier 120 cause an offset cancellation, the electrical shortings cause the input common-mode potential Vicm and the output common-mode potential Vocm to automatically be equal to each other. Further, it is assumed that the operational amplifier 120 has a sufficient gain for an output range whose center is located at the output common-mode potential Vocm. The output range is about a half of the potential difference between the positive power supply potential VDD and the negative power supply potential VSS (specifically, the output range is from $-(VDD-VSS)/2-\alpha$ to $+(VDD-VSS)/2+\alpha$, where $\alpha$ is a small value, "0.2", for example).

The switches S3p and S3n are provided for connecting or disconnecting the output side terminals of the sampling capacitors Csp and Csn and the fourth reference terminals 122. The switches S3p and S3n are controlled by the control circuit 104. Specifically, the switches S3p and S3n are controlled such that the switches S3p and S3n are turned off when the sampling at the sampling capacitors Csp and Csn is not to be performed while the switches S3p and S3n are turned on when the sampling at the sampling capacitors Csp and Csn is to be performed. Further, the switches S4p and S4n are provided for connecting or disconnecting the output side terminals of the sampling capacitors Csp and Csn and the input terminals of the operational amplifier 120. The switch S4 is controlled by the control circuit 104 as described hereinafter.

The negative input terminal of the operational amplifier 120 is connected to a capacitor Cfp via a switch S5p. Further, the positive input terminal of the operational amplifier 120 is connected to a capacitor Cfn via a switch S5n. The switches S5p and S5n are provided for connecting or disconnecting the input terminals of the operational amplifier 120 and the input side terminals of the capacitor Cfp and Cfn. The switches S5p and S5n are controlled by the control circuit 104 as described hereinafter. The capacitors Cfp and Cfn are temporary storage capacitors to which the charges accumulated in the sampling capacitors Csp and Csn are transferred. In the following, the capacitors Cfp and Cfn are referred to as temporary storage capacitors Cfp and Cfn. It is assumed that the temporary storage capacitors Cfp and Cfn have capacities Cfp and Cfn. The capacity Cfp of the temporary storage capacitor Cfp is greater than the capacity Csp of the sampling capacitor Csp, and the capacity Cfn of the temporary storage capacitor Cfn is greater than the capacity Csn of the sampling capacitor Csn. Specifically, Cfp=a*Csp, and Cfn=a*Csn. The value a is greater than 1, and a=2, for example.

To an output side terminal of the temporary storage capacitor Cfp are connected the positive output terminal (voltage Vop) of the operational amplifier 120 via a switch S6p and the second reference terminal 108 via a switch S7p. Further, to an output side terminal of the temporary storage capacitor Cfn are connected the negative output terminal (voltage Von) of the operational amplifier 120 via a switch S6n and the second reference terminal 108 via a switch S7n. The switches S6p and S6n are provided for connecting or disconnecting the output side terminals of the temporary storage capacitors Cfp and Cfn and the output terminals of the operational amplifier 120. The switches S6p and S6n are controlled by the control circuit 104. Further, the switches S7p and S7n are provided for connecting or disconnecting the output side terminals of the temporary storage capacitors Cfp and Cfn and the second reference terminals 108. The switches S7p and S7n are controlled by the control circuit 104.

Further, the positive output terminal of the operational amplifier 120 is connected to the input side terminal of the sampling capacitor Csp via a switch S8p. Further, the negative output terminal of the operational amplifier 120 is connected to the input side terminal of the sampling capacitor Csn via a switch S8n. The switches S8p and S8n are provided for connecting or disconnecting the output terminal of the operational amplifier 120 and the input side terminals of the sampling capacitors Csp and Csn. The switches S8p and S8n are controlled by the control circuit 104.

To the positive output terminal of the operational amplifier 120 are connected positive input terminals of two comparators 124 and 126. Further, to the negative output terminal of the operational amplifier 120 are connected negative input terminals of two comparators 124 and 126. The comparator 124 has a offset of +(Vrefp−Vrefn)/(a*b). Further, the comparator 126 has a offset of −(Vrefp−Vrefn)/(a*b). The comparators 124 and 126 compare voltages input to the input terminals and output the comparison results to the control circuit 104. The control circuit 104 controls connection/disconnection of the switches S2p and S2n based on the comparison results of the comparators 124 and 126 as described hereinafter. However, the value of b is greater than 1, which is necessary to perform the process for preventing the output saturation even though an input analog voltage Vin' (=Vinp−Vinn) is within a predetermined range which is out of the range from the negative power supply potential VSS to the positive power supply potential VDD. The value of b is 2, for example.

Next, with reference to FIG. 8 through FIG. 13, operations of the sample and hold circuit 100 and the A/D converter according to the embodiment are described.

Figure 8:
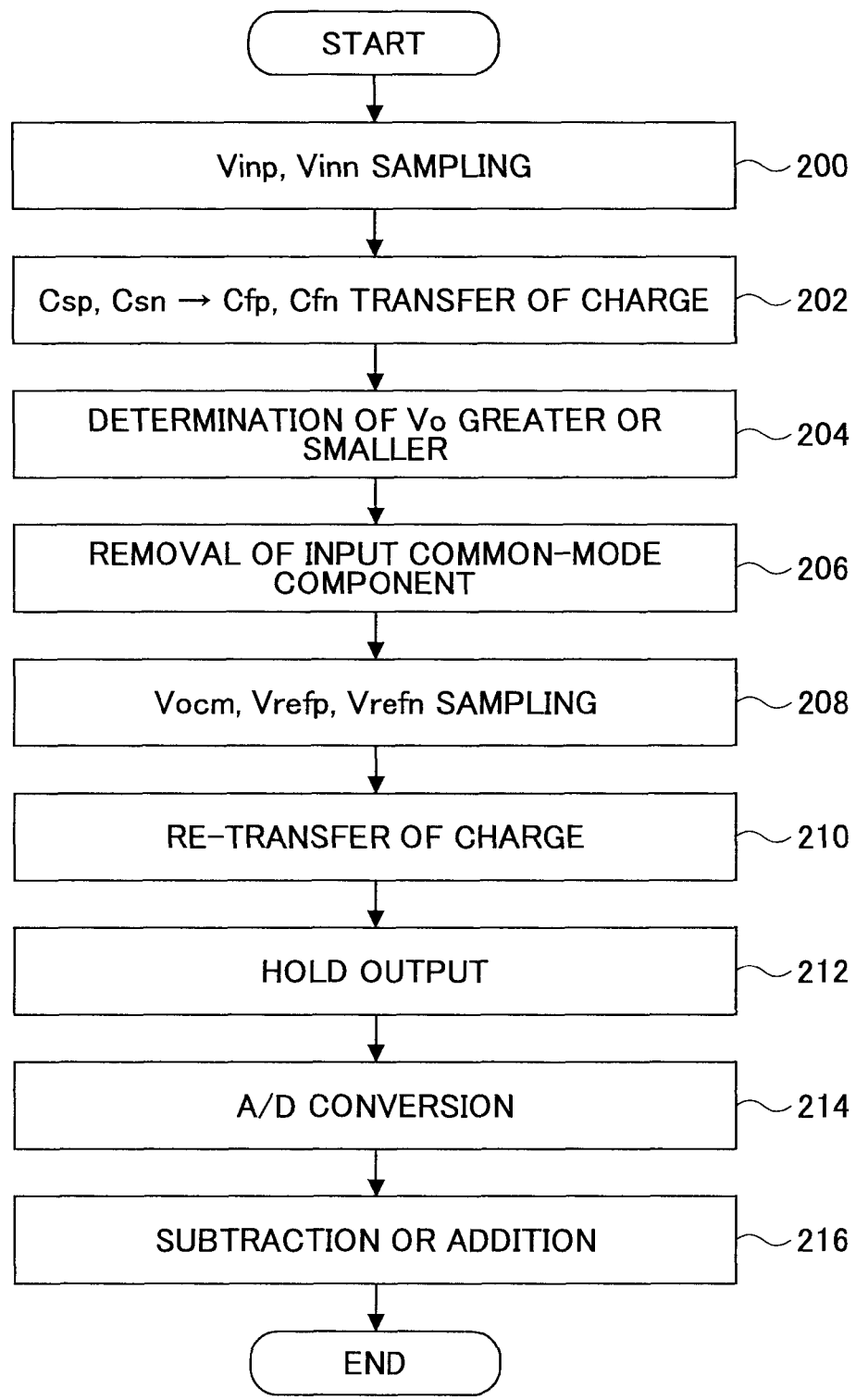
FIG. 8 is a flowchart of an example of a control routine executed in an A/D converter including the sample and hold circuit according the second embodiment of the present invention.
Figure 9:
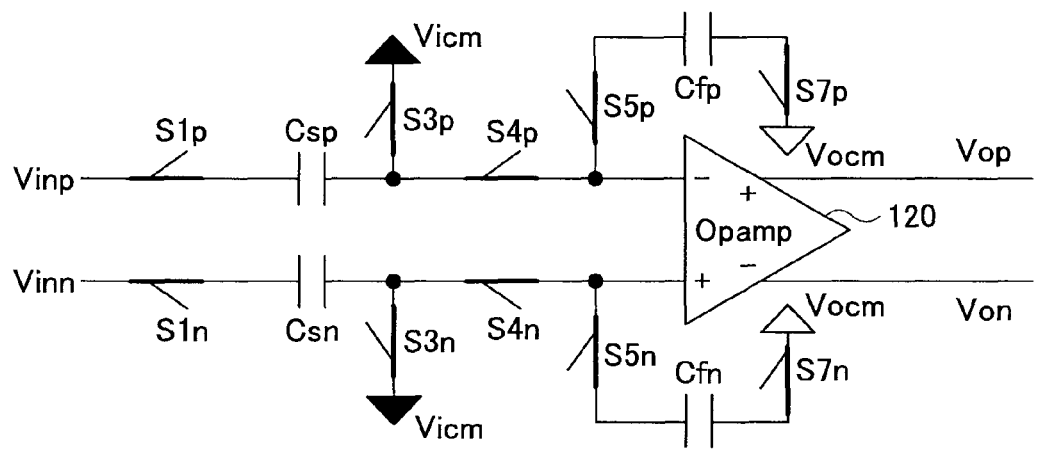
FIG. 9 is a diagram for illustrating a status of the sample and hold circuit according the second embodiment of the present invention which is implemented at the time of sampling an input analog potential Vin.
Figure 10:
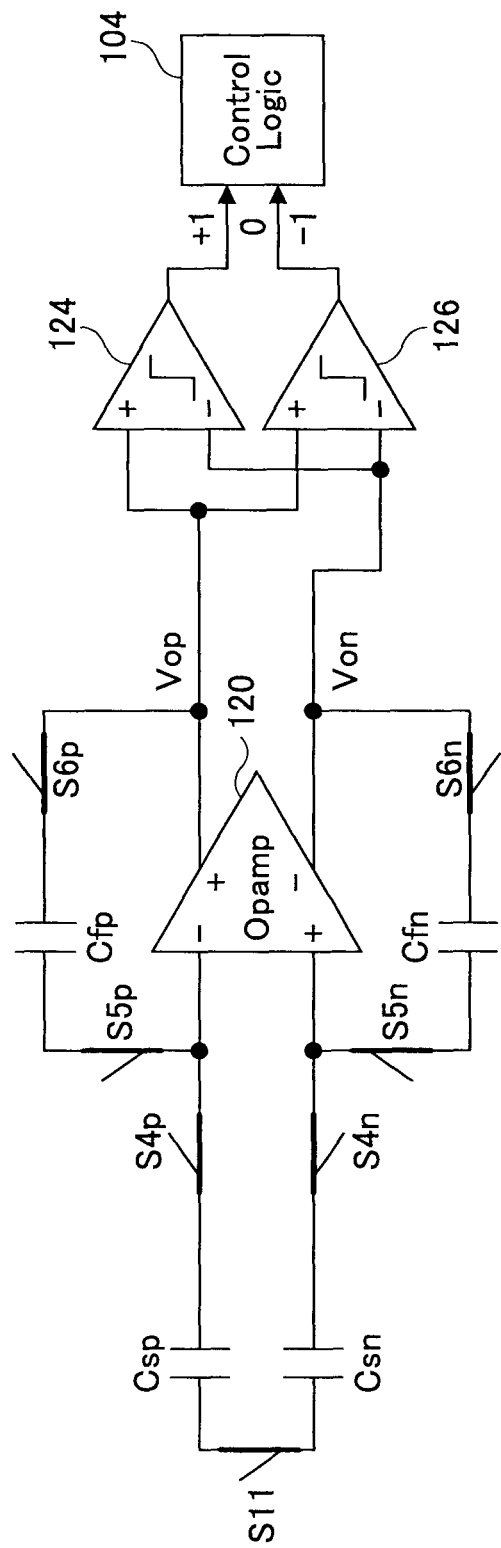
FIG. 10 is a diagram for illustrating a status of the sample and hold circuit according the second embodiment of the present invention which is implemented at the time of transferring charge from a sampling capacitor Cs to a temporary storage capacitor Cf.
Figure 11:
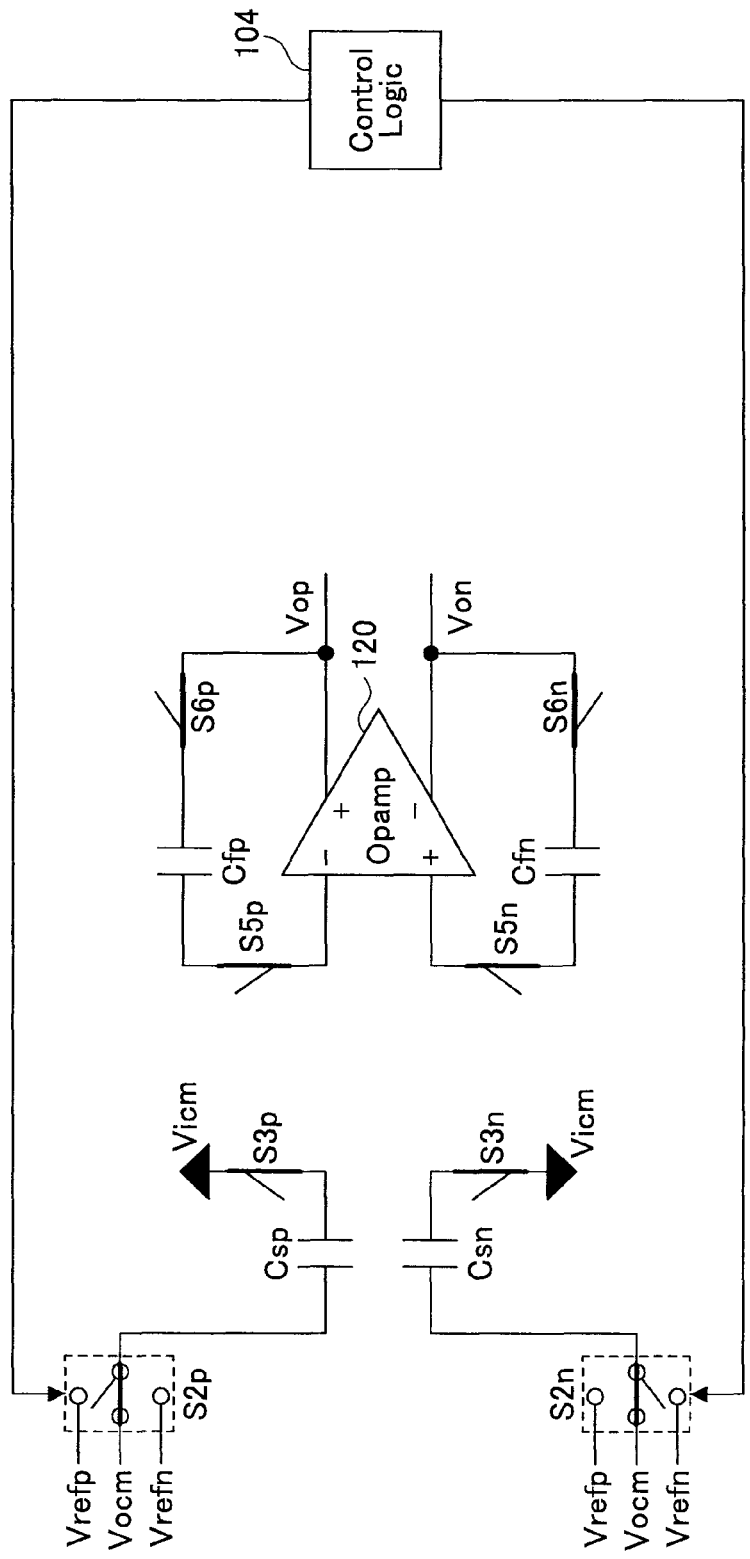
FIG. 11 is a diagram for illustrating a status of the sample and hold circuit according the second embodiment of the present invention which is implemented at the time of sampling a reference potential Vref.
Figure 12:
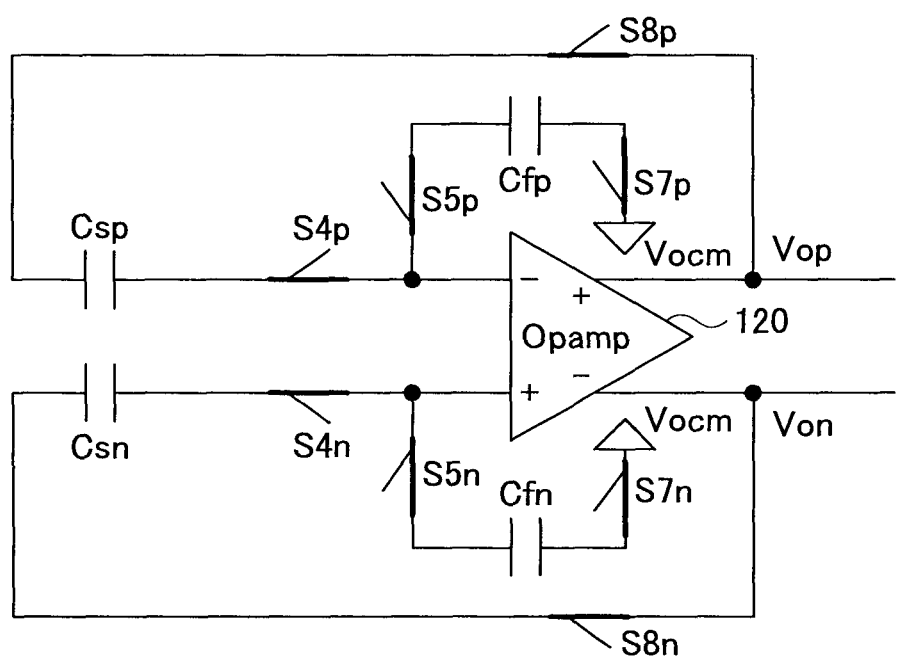
FIG. 12 is a diagram for illustrating a status of the sample and hold circuit according the second embodiment of the present invention which is implemented at the time of transferring charge from the temporary storage capacitor Cf to the sampling capacitor Cs.
Figure 13:
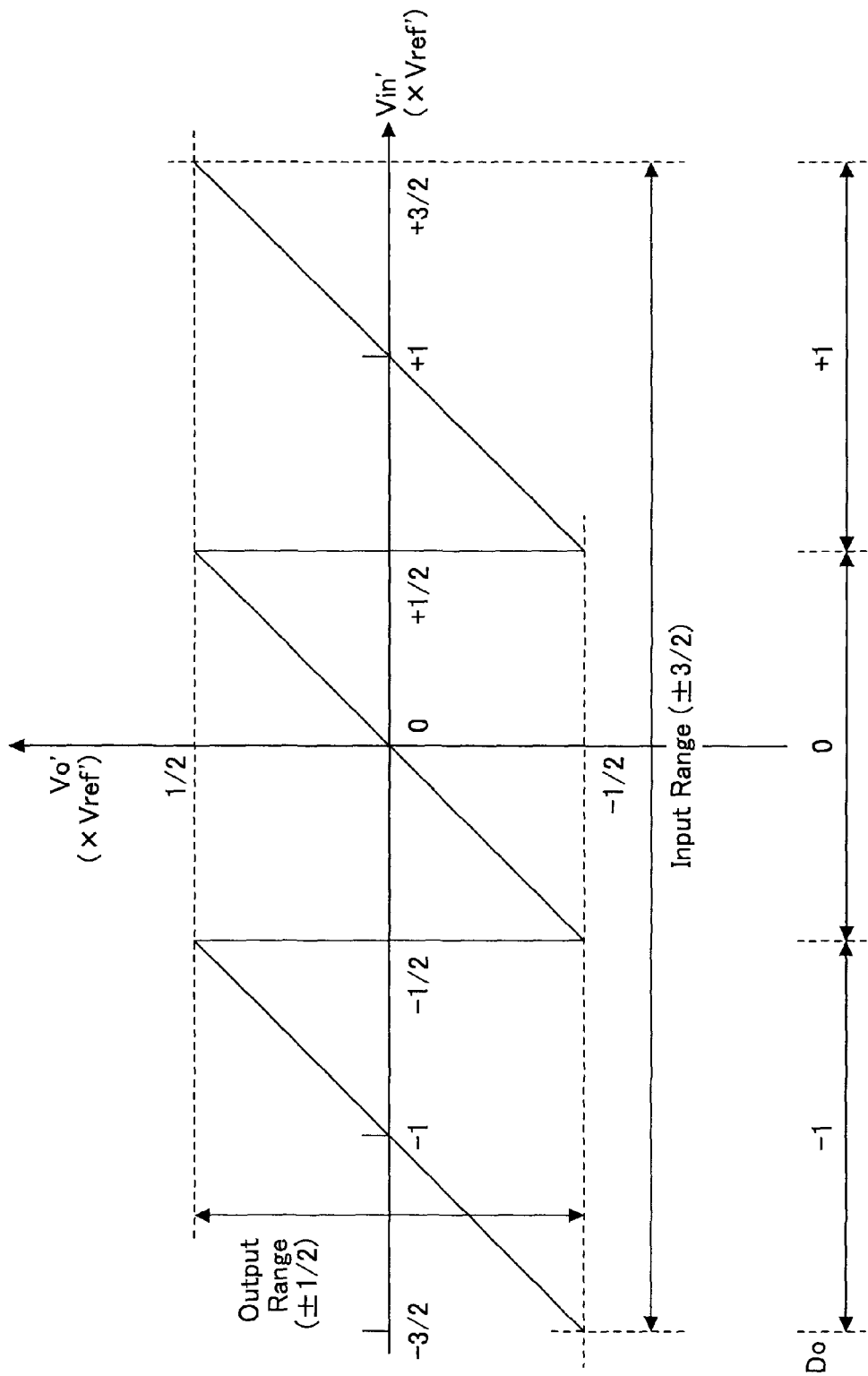
FIG. 13 is a diagram for illustrating a relationship between an input analog voltage Vin' and an output analog voltage Vo' in the sample and hold circuit according the second embodiment of the present invention.

FIG. 8 is a flowchart of an example of a control routine executed in an A/D conversion device including the sample and hold circuit 100 according the embodiment. FIG. 9 is a diagram for illustrating a status of the sample and hold circuit 100 according the embodiment which is implemented at the time of sampling the input analog potential Vin (=Vinp−Vinn). FIG. 10 is a diagram for illustrating a status of the sample and hold circuit 100 according the embodiment which is implemented at the time of transferring charges from the sampling capacitors Csp and Csn to the temporary storage capacitors Cfp and Cfn. FIG. 11 is a diagram for illustrating a status of the sample and hold circuit 100 according the embodiment which is implemented at the time of sampling the reference voltage Vref' (=Vrefp−Vrefn). FIG. 12 is a diagram for illustrating a status of the sample and hold circuit 100 according the embodiment which is implemented at the time of transferring charges from the temporary storage capacitors Cfp and Cfn to the sampling capacitors Csp and Csn. Further, FIG. 13 is a diagram for illustrating a relationship between an input analog voltage Vin' and an output analog voltage Vo' (=Vop−Von) in the sample and hold circuit according the second embodiment of the present invention.

In the embodiment, the switches S1p and S1n are in their OFF states immediately before the A/D converter performs the A/D conversion. When the A/D conversion is performed in such a status, at first, the control circuit 104 of the sample and hold circuit 100 performs sampling of the input analog potentials Vinp and Vinn (step 200). Specifically, at that time, the control circuit 104 turns on the switches S1p and S1n from their OFF states, turns the switches S2p, S2n, S8n, S8p, S9p, S9n and S11 off, and turns the switch S3p and S3n on (see FIG. 9).

When the switches S1p and S3p are turned on and the switch S2p is turned off, a potential difference (input voltage) between the analog potential Vinp input to the input terminal 102p and the input common-mode potential Vicm is applied to the sampling capacitor Csp and thus the charge (input charge) according to the potential difference is accumulated in the sampling capacitor Csp. In this case, the sampling of the input analog potential Vinp is performed at the sampling capacitor Csp. Similarly, when the switches S1n and S3n are turned on and the switch S2n is turned off, a potential difference (input voltage) between the analog potential Vinn input to the input terminal 102n and the input common-mode potential Vicm is applied to the sampling capacitor Csn and thus the charge (input charge) according to the potential difference is accumulated in the sampling capacitor Csn. In this case, the sampling of the input analog potential Vinn is performed at the sampling capacitor Csn.

It is noted that the control circuit 104 turns the switches S4p, S4n, S5p, S5n, S7p and S7n on and turns the switch S6p and S6n off (see FIG. 9) when or before the sampling of the input analog potentials Vinp and Vinn are performed at the sampling capacitors Csp and Csn. When such a switch status is implemented, the temporary storage capacitors Cfp and Cfn are short-circuited to the output common-mode potential Vocm and thus the remaining charge accumulated in the temporary storage capacitors Cfp and Cfn is discharged. For this reason, if the sampling of the input analog potentials Vinp and Vinn is performed at the sampling capacitors Csp and Csn, the charge accumulated in the temporary storage capacitors Cfp and Cfn is reset.

Further, as described above, if the sampling of the input analog potentials Vinp and Vinn is performed at the sampling capacitors Csp and Csn, the output terminals of the operational amplifier 120 may be opened or short-circuited to the output common-mode potential Vocm. Alternatively, the input terminals and the output terminals of the operational amplifier 120 may be short-circuited to implement the offset cancellation.

If the sampling of the input analog potentials Vinp and Vinn at the sampling capacitors Csp and Csn is completed and the input charges according to the input analog potentials Vinp and Vinn are accumulated in the sampling capacitors Csp and Csn, then the control circuit 104 performs a process for transferring the input charges accumulated in the sampling capacitors Csp and Csn to the temporary storage capacitors Cfp and Cfn (step 202). Specifically, at that time, the control circuit 104 turns off the switches S1p, S1n, S7p and S7n from their ON states, and turns on the switches S6p, S6n and S11 from their OFF states (see FIG. 10).

When such a status is implemented, since the sampling capacitors Csp and Csn are connected in series, only the input charges according to a differential component Vin' (=Vinp−Vinn) of the input analog potentials Vinp and Vinn sampled at the sampling capacitors Csp and Csn are transferred from the sampling capacitors Csp and Csn to the temporary storage capacitors Cfp and Cfn. In this case, a differential output voltage Vo' (=Vop−Von) between the positive output terminal and the negative output terminal of the operational amplifier 120 is (Cs/Cf)*Vin' (=1/a*Vin').

Since the value of a is greater than 1 as described above, the differential output voltage Vo' of the operational amplifier 120 is smaller than the input analog potential Vin'. In this case, even if the input analog potential Vin' is near the difference (VDD−VSS) between the positive power supply potential VDD and the negative power supply potential VSS, when the transfer of the charges from the sampling capacitors Csp and Csn to the temporary storage capacitors Cfp and Cfn is performed, the differential output voltage Vo' of the operational amplifier 120 is smaller than the power supply voltage (VDD−VSS) and falls within a range from −(VDD−VSS)/a to +(VDD−VSS)/a. For this reason, the output saturation of the operational amplifier 120 is prevented at the time of transferring the charges from the sampling capacitors Csp and Csn to the temporary storage capacitors Cfp and Cfn, thereby assuring the operations of the operational amplifier 120.

It is noted that if the input charges according to the differential component Vin' are transferred from the sampling capacitors Csp and Csn to the temporary storage capacitors Cfp and Cfn, the charge components according to the input common-mode component (Vinp+Vinn)/2 of the input analog potentials Vinp and Vinn are not transferred to the temporary storage capacitors Cfp and Cfn, that is to say, to the side of the operational amplifier 120, and thus remains in the sampling capacitors Csp and Csn. In this case, the voltage across the sampling capacitors Csp and Csn is the input common-mode potential (Vinp+Vinn)/2. It is noted that, at that time, since the input side terminals of the sampling capacitors Csp and Csn do not have the potentials fixed, the potentials input to the input terminals of the operational amplifier 120 are substantially fixed to the set input common-mode potential Vicm without being affected by the common-mode of the input analog potentials Vinp and Vinn sampled at the sampling capacitors Csp and Csn even if there are common-mode variations in the input analog potentials Vinp and Vinn.

It is noted that if the charges are transferred from the sampling capacitors Csp and Csn to the temporary storage capacitors Cfp and Cfn as described above, the differential output voltage Vo' (=Vop+Von) at the output terminals of the operational amplifier 120 is input to the input terminals of the comparators 124 and 126. The comparators 124 and 126 output the comparison result, which indicates whether the differential output voltage Vo' of the operational amplifier 120 input to the input terminals is within a range from −Vref'/(a*b) to +Vref'/(a*b), to the control circuit 104. For example, the comparator 124 supplies the comparison result, which indicates whether the differential output voltage Vo' of the operational amplifier 120 input to the input terminals is greater than +Vref'/(a*b), to the control circuit 104, and the comparator 126 supplies the comparison result, which indicates whether the differential output voltage Vo' of the operational amplifier 120 input to the input terminals is smaller than −Vref'/(a*b), to the control circuit 104.

The control circuit 104 determines, based on the comparison results from the comparators 124 and 126, whether (1) the differential output voltage Vo' of the operational amplifier 120 is greater than +Vref'/(a*b), (2) within a range from −Vref'/(a*b) to +Vref'/(a*b), or (3) smaller than −Vref'/(a*b) (step 204). Then, the determination result is stored as a digital value D0=+1, 0, −1, for example.

After such a storing process is performed, then the control circuit 104 performs a process for discharging to remove the charge component according to the input common-mode component (Vinp+Vinn)/2 remaining in the sampling capacitors Csp and Csn (step 206). Specifically, at that time, the control circuit 104 connects the switches S2p and S2n to the second reference terminal 108, turns on the switches S3p and S3n from their OFF states, and turns off the switches S4p and S4n from their ON states (see FIG. 11). When such a switch status is implemented, the input common-mode potential Vicm and the output common-mode potential Vocm are applied across the sampling capacitors Csp and Csn and thus the charge components according to the input common-mode component (Vinp+Vinn)/2 remaining in the sampling capacitors Csp and Csn are discharged and removed.

Further, the control circuit 104 performs the voltage sampling at the sampling capacitors Csp and Csn according to the comparison results of the comparators 124 and 126 (step 208) after the sampling capacitors Csp and Csn are discharged. Specifically, at that time, based the comparison results of the comparators 124 and 126, the control circuit 104 connects the switch S2p to the third reference terminal 110 and the switch S2n to the first reference terminal 106 if it determines that Vo'>+Vref'/(a*b), connects the switches S2p and S2n to the second reference terminals 108 if it determines that −Vref'/(a*b)<Vo'<+Vref'/(a*b), and connects the switch S2p to the first reference terminal 106 and the switch S2n to the third reference terminal 110 if it determines that Vo'<−Vref'/(a*b).

When the switch S2p is connected to the third reference terminal 110 and the switch S2n is connected to the first reference terminal 106, the potential difference between the reference potential Vrefn and the input common-mode potential Vicm is applied to the sampling capacitor Csp and the potential difference between the reference potential Vrefp and the input common-mode potential Vicm is applied to the sampling capacitor Csn, and thus the sampling capacitors Csp and Csn have the charges accumulated according to the respective potential differences. Thus, If Vo'>+Vref'/(a*b), the sampling of the reference potential Vrefn at the sampling capacitor Csp and the sampling of the reference potential Vrefp at the sampling capacitor Csn are performed.

Further, when the switches S2p and S2n are connected to the second reference terminals 108, the potential difference between the output common-mode potential Vocm and the input common-mode potential Vicm is applied to the sampling capacitors Csp and Csn, and thus the sampling capacitors Csp and Csn have the charges accumulated according to the applied potential difference. Thus, if Vref'/(a*b)<Vo'<+Vref'/(a*b), the sampling of the output common-mode potential Vocm is performed at the sampling capacitors Csp and Csn.

Further, when the switch S2p is connected to the first reference terminal 106 and the switch S2n is connected to the third reference terminal 110, the potential difference between the reference potential Vrefp and the input common-mode potential Vicm is applied to the sampling capacitor Csp and the potential difference between the reference potential Vrefn and the input common-mode potential Vicm is applied to the sampling capacitor Csn, and thus the sampling capacitors Csp and Csn have the charges accumulated according to the respective potential differences. Thus, If Vo'<−Vref'/(a*b), the sampling of the reference potential Vrefp at the sampling capacitor Csp and the sampling of the reference potential Vrefn at the sampling capacitor Csn are performed.

It is noted that the discharge of the sampling capacitors Csp and Csn and the sampling of the reference potentials Vrefp and Vrefn and the output common-mode potential Vocm are performed in this order; however, they may be performed simultaneously. In this case, the sampling of the reference potentials Vrefp and Vrefn and the output common-mode potential Vocm at the sampling capacitors Csp and Csn is performed, the charge component according to the input common-mode component (Vinp+Vinn)/2, which has been accumulated before the sampling is performed, is discharged and removed automatically.

It is noted that the control circuit 104 keeps the ON states of the switches S5p, S5n, S6p and S6n and turns off the switches S4p, S4n, S9p and S9n from their ON states when the control circuit 24 performs the sampling of the output common-mode potential Vocm or the reference potentials Vrefp and Vrefn at the sampling capacitors Csp and Csn (see FIG. 11). When such a process is performed, the charges transferred to the temporary storage capacitors Cfp and Cfn and accumulated therein are held in the temporary storage capacitors Cfp and Cfn.

When the sampling of the output common-mode potential Vocm or the reference potentials Vrefp and Vrefn at the sampling capacitors Csp and Csn is performed as described above, then the control circuit 104 performs a process for returning the charges, which have been transferred to the temporary storage capacitors Cfp and Cfn and accumulated therein, to the sampling capacitors Csp and Csn (step 210). Specifically, at that time, the control circuit 104 turns off the switches S2, S3 and S6 from their ON states, and turns on the switches S4p, S4n, S7p, S7n, S8p and S8n from their OFF states. When such states of the respective switches are implemented, the charges accumulated in the temporary storage capacitors Cfp and Cfn according to the differential component Vin' Vinp−Vinn) are re-transferred to the sampling capacitors Csp and Csn.

When such a re-transfer of the charges is performed, the voltages across the sampling capacitors Csp and Csn are substantially equal to (Vinp−Vrefp) and (Vinn−Vrefp), if the condition Vo'>+Vref'/(a*b) is met and thus the sampling of the reference potential Vrefn at the sampling capacitor Csp and the sampling of the reference potential Vrefp at the sampling capacitor Csn are performed in step 204. In this case, the differential output voltage Vo' (=Vop−Von) at the output terminal of the operational amplifier 120 is Vin'−Vref'.

Further, the voltages across the sampling capacitors Csp and Csn are substantially equal to Vinp and Vinn, if the condition −Vref'/(a*b)<Vo<+Vref'/(a*b) is met and thus the sampling of the output common-mode potential Vocm at the sampling capacitors Csp and Csn is performed in step 204. In this case, the differential output voltage Vo' (=Vop−Von) at the output terminal of the operational amplifier 120 is Vin'.

Further, the voltages across the sampling capacitors Csp and Csn are substantially equal to (Vinp+Vrefp) and (Vinn+Vrefp), if the condition Vo'<−Vref'/(a*b) is met and thus the sampling of the reference potential Vrefp at the sampling capacitor Csp and the sampling of the reference potential Vrefn at the sampling capacitor Csn are performed in step 204. In this case, the differential output voltage Vo' (=Vop−Von) at the output terminal of the operational amplifier 120 is Vin'+Vref'.

Thus, after the re-transfer of the charges from the temporary storage capacitors Cfp and Cfn to the sampling capacitors Csp and Csn, the voltages across the sampling capacitors Csp and Csn are Vin'−Vref' if Vo'>+Vref'/(a*b), that is to say, if Vin'>+Vref'/b; Vin' if −Vref'/(a*b)<Vo'<+Vref'/(a*b), that is to say, −Vref'/b<Vin'<+Vref'/b; and Vin'+Vref' if Vo'<−Vref', that is to say, Vin'<−Vref'/b. For this reason, the differential output voltage Vo' at the output terminal of the operational amplifier 120 falls within a range from −Vref'/b to +Vref'/b. The output analog voltage Vo' of the operational amplifier 120 is sampled, held and output (step 212).

In this way, according to the sample and hold circuit 100 of the present embodiment, if the input analog voltages Vinp and Vinn are within a range of the reference voltage Vref' (=the power supply potential VDD−VSS), the differential output voltage Vo' sampled and held to be output can be adjusted to fall within the range from −Vref'/b to +Vref'/b.

As described above, the value of b is greater than 1, which is necessary to perform the process for preventing the output saturation even though an input analog voltage Vin' (=Vinp−Vinn) is within a predetermined range which is out of the range from the negative power supply potential VSS to the positive power supply potential VDD. For this reason, the sample and hold circuit 100 performs the sample and hold process without causing the output saturation of the operational amplifier 120, if the differential output voltage Vo' is near the negative power supply potential VSS or the positive power supply potential VDD, or if the differential output voltage Vo' is slightly smaller than the negative power supply potential VSS or greater than the positive power supply potential VDD. In other words, the sample and hold circuit 100 can prevent the output saturation for the differential output voltage Vo' from the negative power supply potential VSS to the positive power supply potential VDD (and further the differential output voltage Vo' which is slightly smaller than the negative power supply potential VSS or greater than the positive power supply potential VDD) in performing the sample and hold process. Further, conversely, the sample and hold circuit 100 can increase a range of the differential output voltage Vo' which is permitted in terms of preventing the output saturation to b times (greater than one time) of the range of the power supply voltage (VDD−VSS).

Further, according to the sample and hold circuit 100, even if the input common-mode component Vicm (=(Vinp−Vinn)/2) of the input analog potential Vinp and Vinn is greatly deviated from the output common-mode potential Vocm, only the input charge according to the differential component Vin' (=Vinp−Vinn) of the input analog potential Vinp and Vinn is transferred from the sampling capacitors Csp and Csn to the temporary storage capacitors Cfp and Cfn. In other words, the input charge according to the input common-mode component Vicm (Vinp+Vinn)/2 is not transferred from the sampling capacitors Csp and Csn to the temporary storage capacitors Cfp and Cfn. Then, the input common-mode component Vicm (Vinp+Vinn)/2 remaining in the sampling capacitors Csp and Csn is discharged and removed by the sampling of the reference potentials Vrefp and Vrefn and the output common-mode potential Vocm.

For this reason, according to the sample and hold circuit 100, even if the input analog potentials Vinp and Vinn, in which the input common-mode potential Vicm is changed, is applied, the deviation of the input potential of the operational amplifier 120 from a predetermined design value can be suppressed, and only the differential input component Vin' (=Vinp−Vinn) of the input analog potential Vinp, Vinn can be sampled and held precisely. Further, according to the sample and hold circuit 100, the input potential of the operational amplifier 120 can be made free from the influence of the input common-mode component Vicm by removing the input common-mode component Vicm, which enables the A/D converter to perform the differential input A/D conversion with high CMRR (Common-Mode Rejection Ratio).

It is noted that, according to the sample and hold circuit 100 described above, in the course of holding the differential output voltage Vo' based on the differential input voltage Vin', the sampling of the input analog potentials Vinp and Vinn is performed at the sampling capacitors Csp and Csn, the sampling of the reference potentials Vrefp and Vrefn or the output common-mode potential Vocm after the transfer of the charges from the sampling capacitors Csp and Csn to the temporary storage capacitors Cfp and Cfn is performed at the sampling capacitors Csp and Csn, and then the charges accumulated in the temporary storage capacitors Cfp and Cfn are returned to the sampling capacitors Csp and Csn to perform the hold and output process from the operational amplifier 120. In the sample and hold circuit 100, the respective processes from the input of the differential input voltage Vin' to the output of the differential output voltage Vo' are performed using the sampling capacitors Csp and Csn as a base point. For this reason, according to the sample and hold circuit 100, even if the ratios between the capacity values of the sampling capacitors Csp and Csn and the capacity values of the temporary storage capacitors Cfp and Cfn (i.e., the value a) have variations or there are variations between the ratio of the capacity value of the sampling capacitor Csp to the capacity value of the temporary storage capacitor Cfp and the ratio of the capacity value of the sampling capacitor Csn to the capacity value of the temporary storage capacitor Cfn, the sample and hold circuit 20 can perform the hold and output process of the differential output voltage Vo without being influenced by the variations.

In the embodiment, the A/D converter converts the differential output voltage Vo' output from the sample and hold circuit 100 to a digital value (step 214). It is noted that since the differential output voltage Vo' output from the sample and hold circuit 100 is obtained through an addition or a subtraction of the charge or the voltage due to the charge transfers between the sampling capacitors Csp and Csn and the temporary storage capacitors Cfp and Cfn and the voltage sampling, it does not correspond to the differential input voltage Vin' in a one-to-one relationship.

Therefore, the A/D converter adds or subtracts a digital value corresponding to the added or subtracted charge or voltage, if necessary, to or from the digital value obtained by the A/D conversion in step 214 to calculate a final output digital value. Then, the A/D converter outputs the calculated final digital value to the outside.

Specifically, the A/D converter reads the determination result of step 204 from the memory. Further, the A/D converter determines that the subtraction of the charge corresponding the reference voltage Vref' from the charges accumulated in the sampling capacitors Csp and Csn is performed at the time of transferring the charges from the sampling capacitors Csp and Csn to the temporary storage capacitors Cfp and Cfn if Vin'>+Vref'/b, and outputs the digital value, which is obtained by adding the digital value corresponding the reference voltage Vref' to the digital value obtained by A/D converting the differential output voltage Vo' in order to compensate for the subtraction, as the final output digital value. Further, the A/D converter determines that the addition or the subtraction of the charge is not performed in the processes from the input of the differential input voltage Vin' to the output of the differential output voltage Vo' if −Vref'/b<Vin'<Vref'/b, and outputs the digital value, which is obtained by A/D converting the differential output voltage Vo', as it is as the final output digital value. Further, the A/D converter determines that the addition of the charge corresponding the reference voltage Vref' to the charges accumulated in the sampling capacitors Csp and Csn is performed at the time of re-transferring the charges from the temporary storage capacitors Cfp and Cfn back to the sampling capacitors Csp and Csn if Vin'<−Vref'/b, and outputs the digital value, which is obtained by subtracting the digital value corresponding to the reference voltage Vref' from the digital value obtained by A/D converting the differential output voltage Vo' in order to compensate for the addition, as the final output digital value.

According to the digital process, a differential digital output which corresponds to the differential input voltage Vin' in a one-to-one relationship can be obtained. Thus, according to the A/D converter, it is possible to precisely perform the A/D conversion of the differential input voltage Vin' in the range which is slightly greater than the range from the negative power supply potential VSS to the positive power supply potential VDD, in addition to the range from the negative power supply potential VSS to the positive power supply potential VDD. Further, according to the digital process, a precise A/D conversion to obtain the differential digital output which corresponds to the differential input voltage Vin' in a one-to-one relationship can be implemented by simple digital calculations such an addition or a subtraction of the digital value.

For example, if it is assumed that the condition b=2 is met, as illustrated in FIG. 13, the differential output voltage Vo' to be held and output falls in a range from −Vref'/2 to +Vref'/2 for the differential input voltage Vin' ranging from −3/2*Vref' to +3/2*Vref'. In other words, when Vref'/2 is assured for the output voltage range of the operational amplifier 120, the sample and hold process and the A/D conversion can be implemented with high accuracy even if the differential input voltage Vin' varies over a wider range up to the one-half of the power supply voltage (VDD−VSS).

It is noted that the comparators 124 and 126 of the sample and hold circuit 100 have predetermined offsets; however, even if the offsets have deviations from design values, they do not substantially affect A/D conversion characteristics of the A/D converter. This is because if the operational amplifier 120 has a sufficient gain over the output voltage range, the A/D converted digital value or the final digital output value obtained by addition or the subtraction of the value is not effected, although the offset variations of the comparators 124 and 126 have a slight influence on the differential input voltage Vin' of the operational amplifier 120.

According to the second embodiment described above, the switches S1p and S1n correspond to "first switches" in claims; the sampling capacitors Csp and Csn correspond to "a first sampling part" and "a second sampling part" in claims; the reference potentials Vrefp and Vrefn or the output common-mode potential Vocm corresponds to "predetermined reference voltages" in claims; the switches S4p, S4n, S5p, S5n, S7p and S7n correspond to "second switches" in claims; the switch S11 corresponds to "a third switch" in claims; the switches S2p and S2n corresponds to "a fourth switch" in claims; "an adding/subtracting part" and "a hold part" in claims are implemented by the processes 202 through 212 executed by the switches S2p, S2n through S8p, S8n and S11, the temporary storage capacitores Cfp, Cfn, the operational amplifier 120, the comparators 124 and 126 and the control circuit 104; and "a re-transferring part" in claims is implemented by the process 210 executed by the control circuit 104.

Further, "an A/D converting part" in claims is implemented by the process 214 executed by the A/D converter, and "a digital value calculating part" is implemented by the process 216 executed by the A/D converter.

It is noted that according to the first and second embodiments, the sampling of the input analog potentials Vin, Vinp and Vinn is performed in the sample and hold circuits 20 and 100, the charges obtained by the sampling are transferred from the sampling capacitors Cs, Csp and Csn to the temporary storage capacitors Cf, Cfp and Cfn, and then the reference potentials Vref, Vrefp, Vrefn and Vocm are sampled in the sample and hold circuit 20 and 100; however, conversely, at first, the reference potentials Vref, Vrefp, Vrefn and Vocm may be sampled in the sample and hold circuits 20 and 100, the charges obtained by the sampling may be transferred from the sampling capacitors Cs, Csp and Csn to the temporary storage capacitors Cf, Cfp and Cfn, then the sampling of the input analog potentials Vin, Vinp and Vinn may be performed in the sample and hold circuits 20 and 100.

The invention claimed is:

1. A sample and hold circuit, comprising:
a first switch which is turned on when an input voltage is to be sampled;
a first sampling part configured to sample the input voltage input via the first switch when the first switch is turned on;
a second sampling part configured to sample a predetermined reference voltage when the first switch is turned off;
an adding/subtracting part configured to perform an addition or a subtraction between the input voltage sampled by the first sampling part and the predetermined reference voltage sampled by the second sampling part; and
a hold part configured to hold and output a voltage obtained by the addition or the subtraction by the adding/subtracting part,
wherein the first and the second sampling parts are a common sampling capacitor which is capable of accumulating an input charge according to the input voltage and a reference charge according to the reference voltage, and
the adding/subtracting part includes
a second switch which is turned on after the input charge is accumulated in the sampling capacitor,
a temporary storage capacitor to which the input charge accumulated in the sampling capacitor is transferred when the second switch is turned on,
a third switch which is turned on after the input charge accumulated in the sampling capacitor is transferred to the temporary storage capacitor, and
a re-transferring part which returns the input charge, which has been transferred to the temporary storage capacitor, after the reference charge is accumulated in the sampling capacitor when the third switch is turned on, in order to perform the addition or the subtraction of the charge accumulated in the sampling capacitor.

2. The sample and hold circuit of claim 1, wherein the hold part includes
an operational amplifier, and
a fourth switch which is provided on a line connecting a connection point between the first switch and the sampling capacitor and an output terminal of the operational amplifier and turned on when a hold output is performed,
the second switch and the temporary storage capacitor are provided on a line connecting a connection point between the sampling capacitor and an input terminal of the operational amplifier and a connection point between the fourth switch and the output terminal of the operational amplifier.

3. The sample and hold circuit of claim 1, wherein a capacity of the temporary storage capacitor is greater than that of the sampling capacitor.

4. The sample and hold circuit of claim 1, wherein the adding/subtracting part includes
a first comparing part configured to determine whether the input voltage sampled by the first sampling part is greater than a first predetermined value, and
an applying voltage switching part configured to switch, according to a determination result of the first comparing part, the predetermined reference voltage to be applied to an input side terminal of the sampling capacitor when the third switch is turned on at the time of transferring the input charge accumulated in the sampling capacitor to the temporary storage capacitor.

5. The sample and hold circuit of claim 4, wherein the hold part includes an operational amplifier,
the adding/subtracting part includes
a fifth switch configured to electrically connect an output side terminal of the temporary storage capacitor and the output terminal of the operational amplifier after the input charge accumulated in the sampling capacitor is transferred to the temporary storage capacitor;
a second comparing part configured to determine whether a voltage of the output terminal of the operational amplifier after the input charge accumulated in the sampling capacitor is transferred to the temporary storage capacitor is greater than a second predetermined value; and
a sampling voltage switching part configured to switch the predetermined reference voltage sampled by the second sampling part according to a determination result of the second comparing part, and
the re-transferring part returns the input charge, which has been transferred to the temporary storage capacitor, to the sampling capacitor in which the reference charge according to the predetermined reference voltage is accumulated, after the predetermined reference voltage is sampled by the second sampling part.

6. An A/D converter, comprising:
an A/D converting part configured to perform an A/D conversion of an analog output voltage output by the hold part of the sample and hold circuit of claim 1; and
a digital value calculating part configured to derive an output digital value by performing an addition or a subtraction between a digital value obtained as a result of the A/D conversion by the A/D converting part and a digital value corresponding to the predetermined reference voltage sampled by the second sampling capacitor.

7. A sample and hold circuit for sampling and holding a potential difference between two input voltages, comprising:
- a pair of first switches which is turned on when the respective input voltages are to be sampled;
- a pair of sampling capacitors configured to accumulate input charges according to the input voltages input via the first switches in order to sample the input voltages input via the first switches when the first switches are turned on and reference charges according to two predetermined reference voltages in order to sample the predetermined reference voltages when the first switches are turned off;
- an adding/subtracting part configured to perform an addition or a subtraction between the input voltages sampled by the pair of the sampling capacitors and the predetermined reference voltages sampled by the pair of the sampling capacitors; and
- a hold part configured to hold and output the potential difference between two voltages obtained by the addition or the subtraction by the adding/subtracting part, wherein
the adding/subtracting part includes
- a pair of second switches which is turned on after the input charges are accumulated in the pair of the sampling capacitors,
- a pair of temporary storage capacitors to which the input charges accumulated in the pair of the sampling capacitors are transferred when the pair of the second switches is turned on,
- a third switch configured to connect input side terminals of the pair of the sampling capacitors when the input charges accumulated in the pair of the sampling capacitors are transferred to the pair of the temporary storage capacitors,
- a pair of fourth switches which is turned on after the input charges accumulated in the pair of the sampling capacitors are transferred to the pair of the temporary storage capacitors, and
- a re-transferring part which returns the input charges, which have been transferred to the pair of the temporary storage capacitors, after the reference charges are accumulated in the pair of the sampling capacitors when the pair of the fourth switches is turned on, in order to perform the addition or the subtraction of the charges accumulated in the pair of the sampling capacitors.

8. The sample and hold circuit of claim 7, wherein the adding/subtracting part removes an amount of charges when turning on the pair of the fourth switches causes the reference charges to be accumulated in the pair of the sampling capacitors, the amount of charges corresponding to an input common-mode and remaining in the pair of the sampling capacitors.

9. An A/D converter, comprising:
- an ND converting part configured to perform an A/D conversion of a potential difference between two analog output voltages output by the hold part of the sample and hold circuit of claim 7; and
- a digital value calculating part configured to derive an output digital value by performing an addition or a subtraction between a digital value obtained as a result of the A/D conversion by the A/D converting part and digital values according to the predetermined reference voltages sampled by the pair of the sampling capacitors.

* * * * *